United States Patent
Neelapala et al.

(10) Patent No.: US 11,569,353 B2
(45) Date of Patent: Jan. 31, 2023

(54) APPARATUSES INCLUDING PASSING WORD LINES COMPRISING A BAND OFFSET MATERIAL, AND RELATED METHODS AND SYSTEMS

(71) Applicant: Micron Technology, Inc., Boise, ID (US)

(72) Inventors: Venkata Naveen Kumar Neelapala, Hyderabad (IN); Deepak Chandra Pandey, Uttarakhand (IN)

(73) Assignee: Micron Technology, Inc., Boise, ID (US)

( * ) Notice: Subject to any disclaimer, the term of this patent is extended or adjusted under 35 U.S.C. 154(b) by 87 days.

(21) Appl. No.: 17/165,753

(22) Filed: Feb. 2, 2021

(65) Prior Publication Data
US 2022/0246727 A1  Aug. 4, 2022

(51) Int. Cl.
*H01L 27/108* (2006.01)
*H01L 29/165* (2006.01)

(52) U.S. Cl.
CPC ...... *H01L 29/165* (2013.01); *H01L 27/10814* (2013.01); *H01L 27/10823* (2013.01); *H01L 27/10876* (2013.01); *H01L 27/10891* (2013.01)

(58) Field of Classification Search
CPC ......... H01L 27/10823; H01L 27/10876; H01L 27/10891
USPC ....................................................... 257/330
See application file for complete search history.

(56) References Cited

U.S. PATENT DOCUMENTS

| | | |
|---|---|---|
| 5,892,707 A | 4/1999 | Noble |
| 7,358,145 B2 | 4/2008 | Yang |
| 7,381,649 B2 | 6/2008 | Chen et al. |
| 7,964,913 B2 | 6/2011 | Darwish |
| 8,410,534 B2 | 4/2013 | Goldman |
| 8,927,387 B2 | 1/2015 | Cheng et al. |
| 9,136,343 B2 | 9/2015 | Rachmady et al. |
| 9,385,132 B2 | 7/2016 | Heineck et al. |
| 9,449,978 B2 | 9/2016 | Karda et al. |
| 9,543,433 B2 | 1/2017 | Anathan et al. |
| 9,636,133 B2 | 5/2017 | Hall et al. |
| 9,716,146 B2 | 7/2017 | Peng et al. |
| 10,374,063 B2 | 8/2019 | Xu |
| 2007/0187716 A1 | 8/2007 | Chu |
| 2008/0042233 A1 | 2/2008 | Kim |

(Continued)

FOREIGN PATENT DOCUMENTS

WO   2017/052621 A1   3/2017

OTHER PUBLICATIONS

Hu et al., Epitaxial Heterostrutures: Side-to-Side Si—ZnS, Si—ZnSe Biaxial Nanowires, and Sandwichlike ZnS—Si—ZnS Triaxial, J. Am. Chem. Soc., vol. 125, No. 37, (2003), pp. 11306-11313.

(Continued)

*Primary Examiner* — Hoai V Pham
(74) *Attorney, Agent, or Firm* — TraskBritt

(57) ABSTRACT

An apparatus comprises active word lines extending within a semiconductive material, passing word lines extending adjacent to the active word lines within the semiconductive material, isolation regions adjacent to the passing word lines, and a band offset material adjacent to the passing word lines and the isolation regions. The semiconductive material exhibits a first bandgap and the band offset material exhibits a second, different bandgap. Related methods and systems are also described.

23 Claims, 15 Drawing Sheets

(56) References Cited

U.S. PATENT DOCUMENTS

| | | |
|---|---|---|
| 2008/0085587 A1 | 4/2008 | Wells et al. |
| 2011/0147711 A1 | 6/2011 | Pillarisetty et al. |
| 2012/0292665 A1 | 11/2012 | Marino et al. |
| 2014/0084246 A1 | 3/2014 | Pillarisetty et al. |
| 2016/0172363 A1 | 6/2016 | Doebler |
| 2020/0044062 A1 | 2/2020 | Fan et al. |
| 2021/0280430 A1* | 9/2021 | Ke .................... H01L 27/10823 |

OTHER PUBLICATIONS

Landis et al., Wide-Bandgap Epitaxial Heterojunction Windows for Silicon Solar Cells, IEEE Transactions on Electron Devices, vol. 37, No. 2, (Feb. 1990), pp. 372-381.

Lin, Sheng, Analysis and Design of Robust Storage Elements in Nanometric Circuits, Dissertation from The Department of Electrical Computer Engineering at Northeastern University, May 2011, 166 pages.

Pandey et al., U.S. Appl. No. 16/899,339 titled Microelectronic Devices Including Passing Word Line Structures, and Related Electronic Systems and Methods, filed Jun. 11, 2020.

Yokoyama et al., Molecular Beam Epitaxial Growth of ZnS on a (100)-Oriented Si Substrate, Journal of Crystal Growth, vol. 81, (1987), pp. 73-78.

* cited by examiner

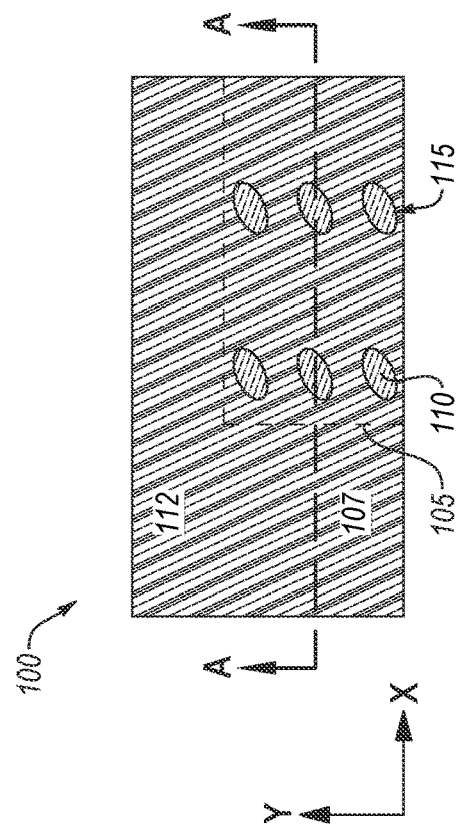
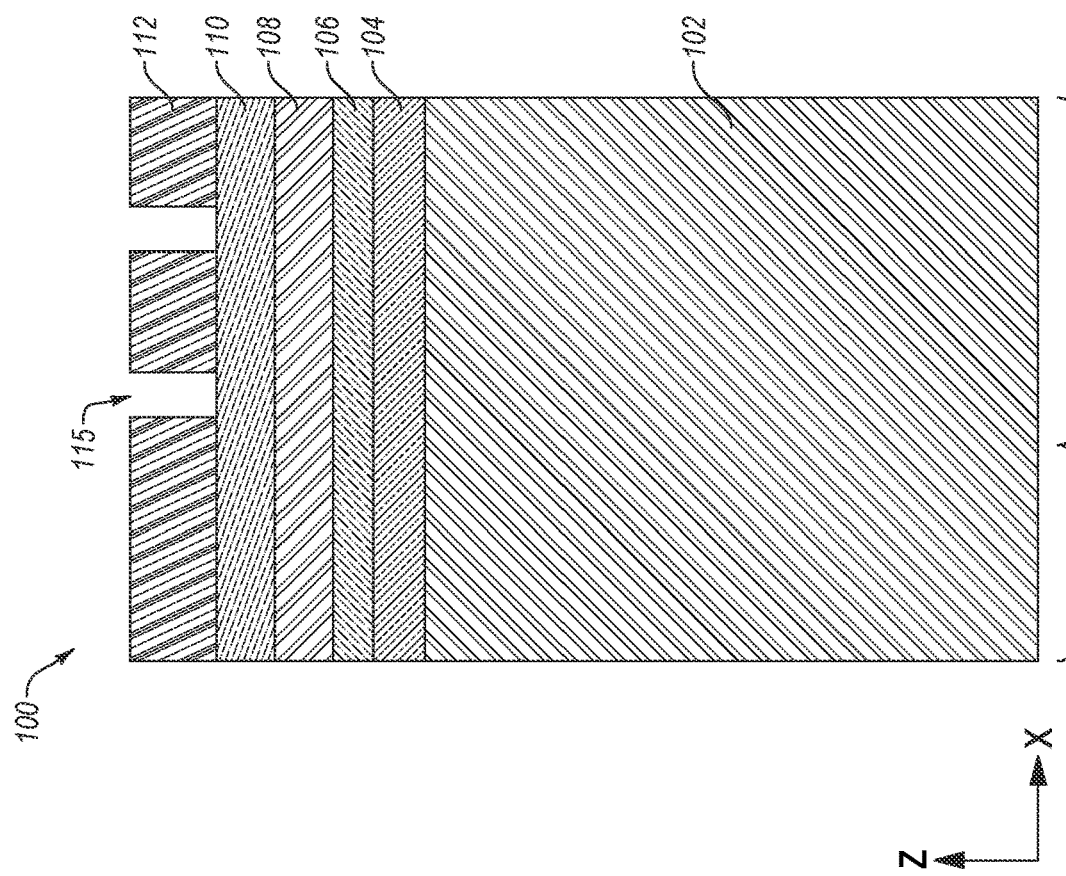
FIG. 1B
FIG. 1A

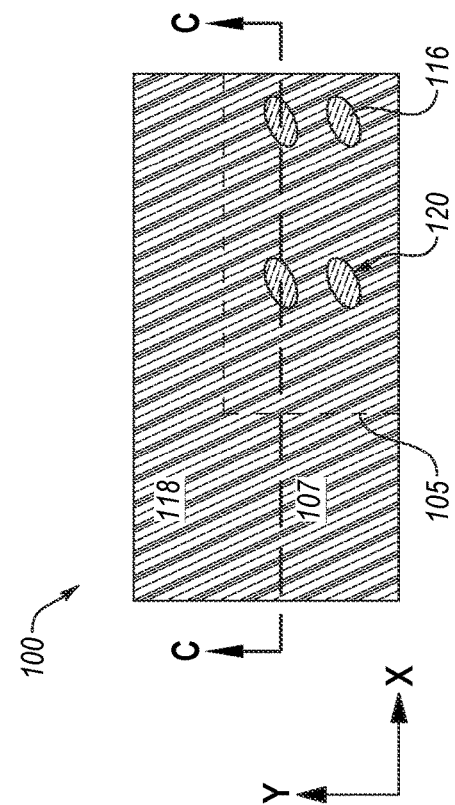
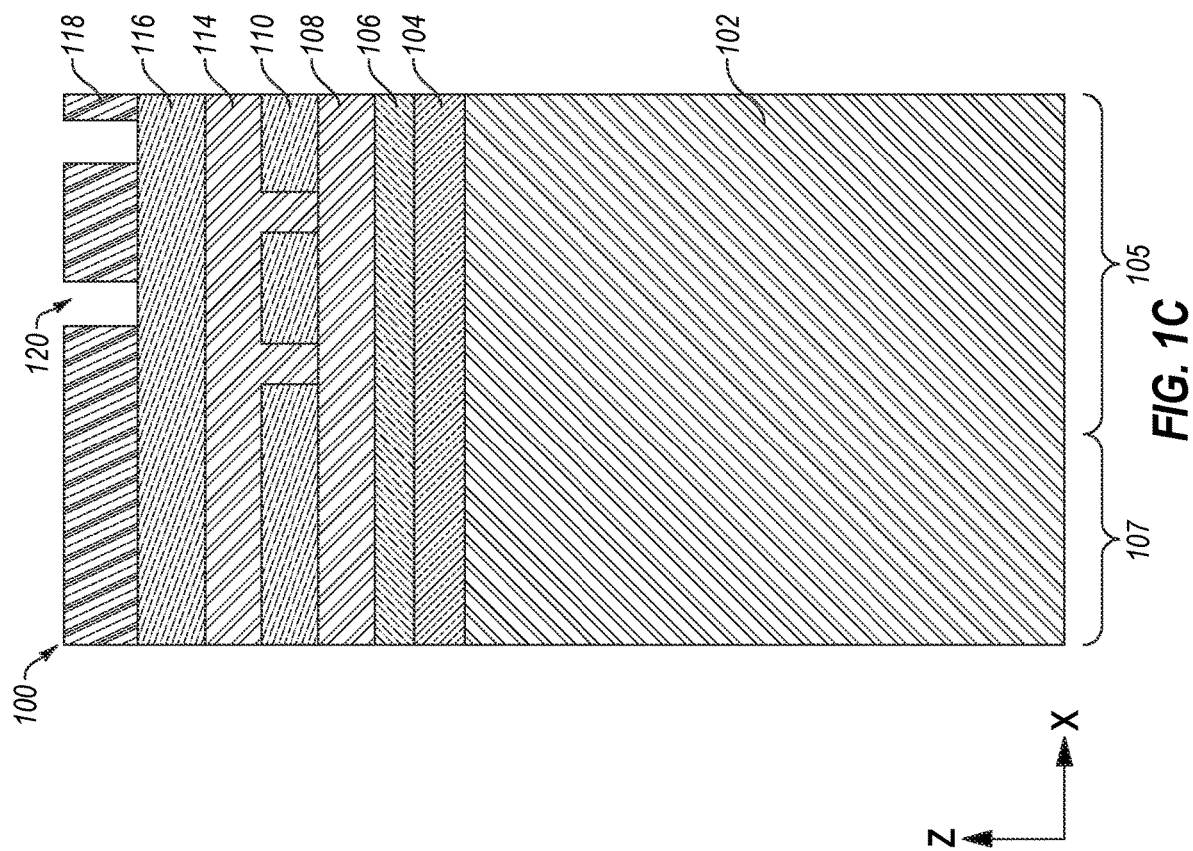
FIG. 1D
FIG. 1C

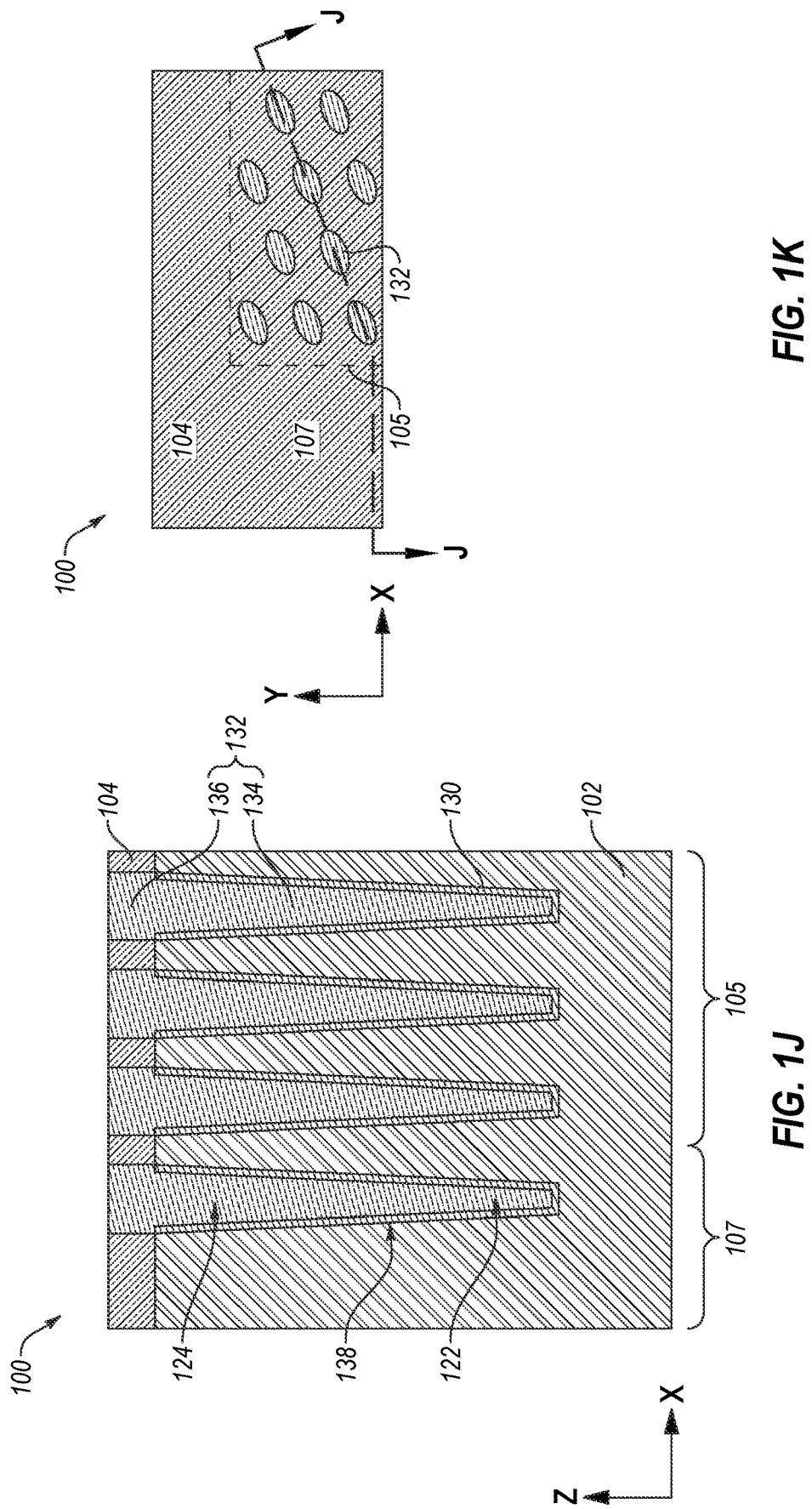

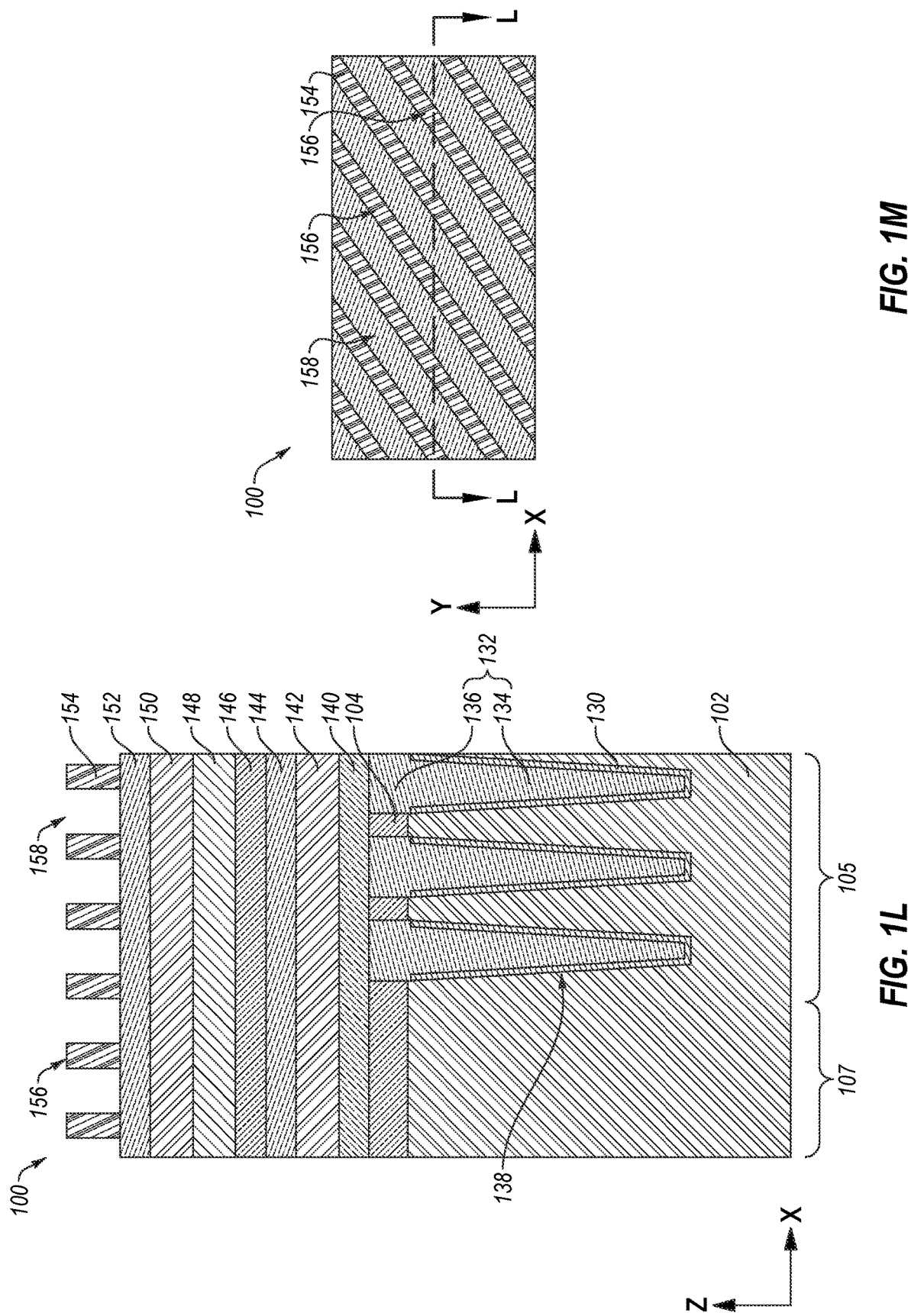

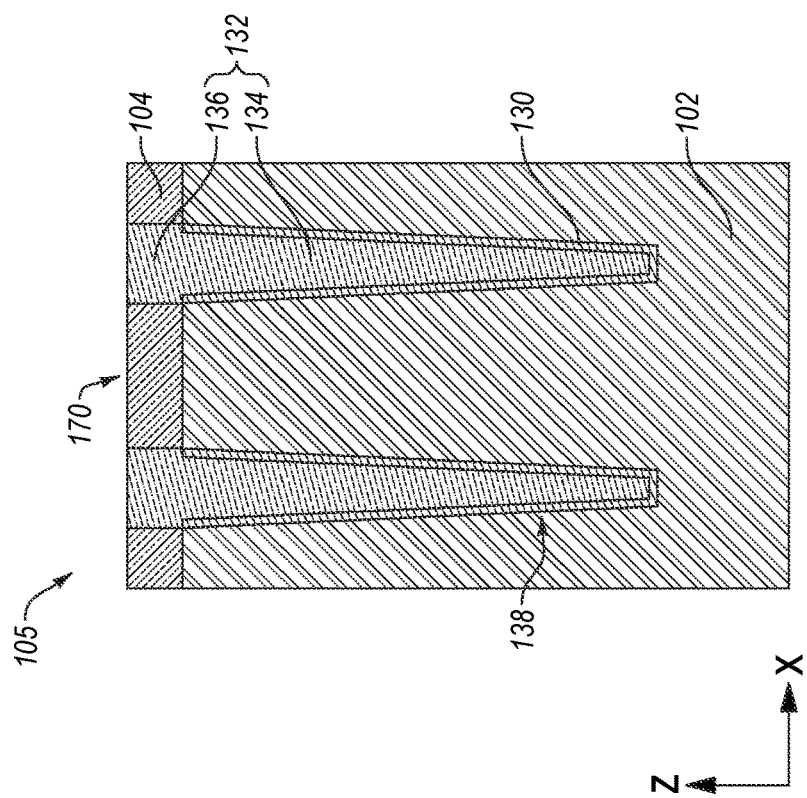
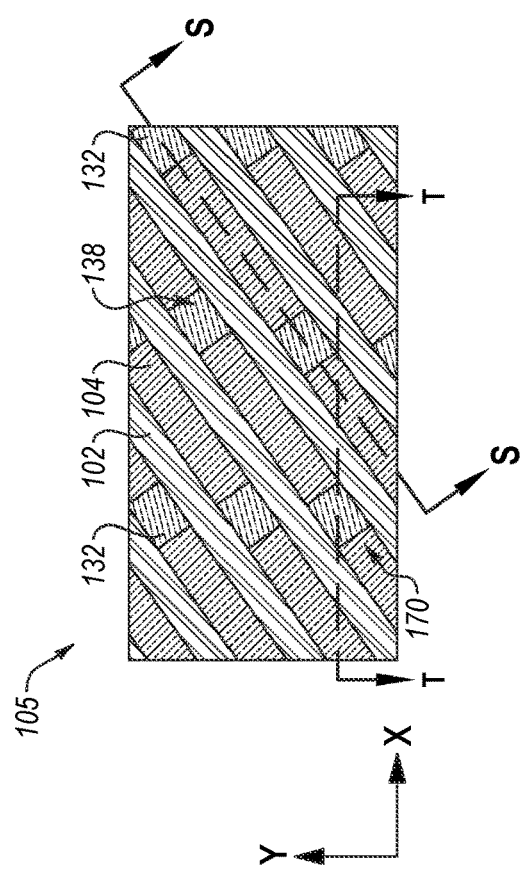
FIG. 1S
FIG. 1R

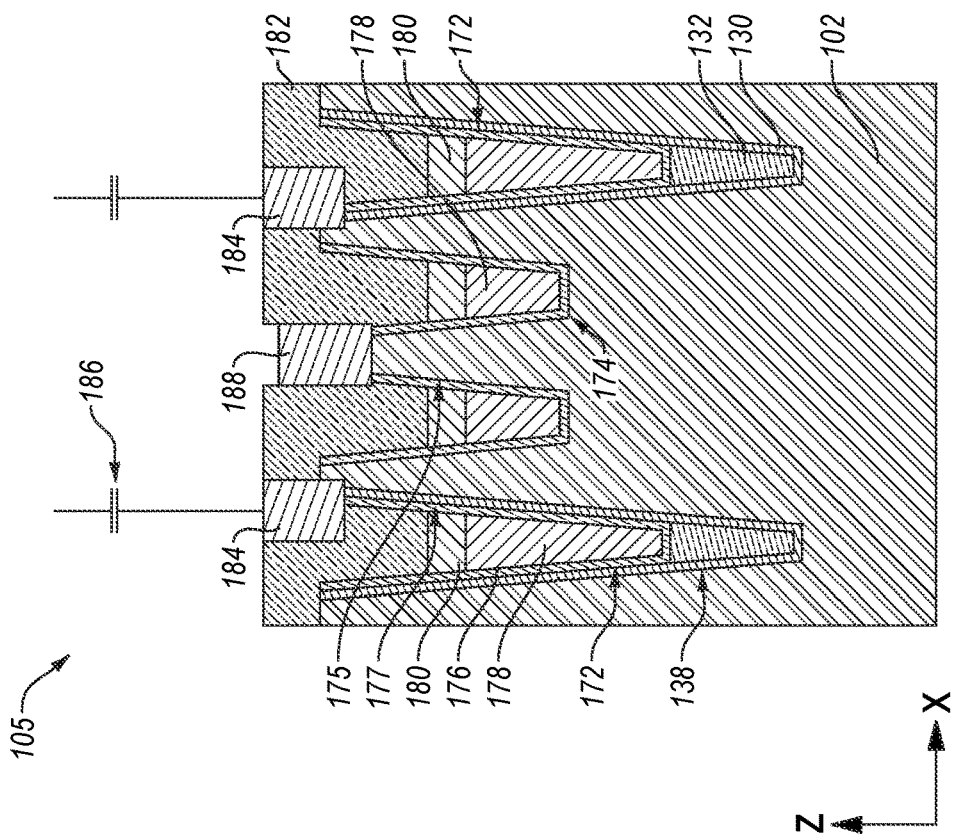
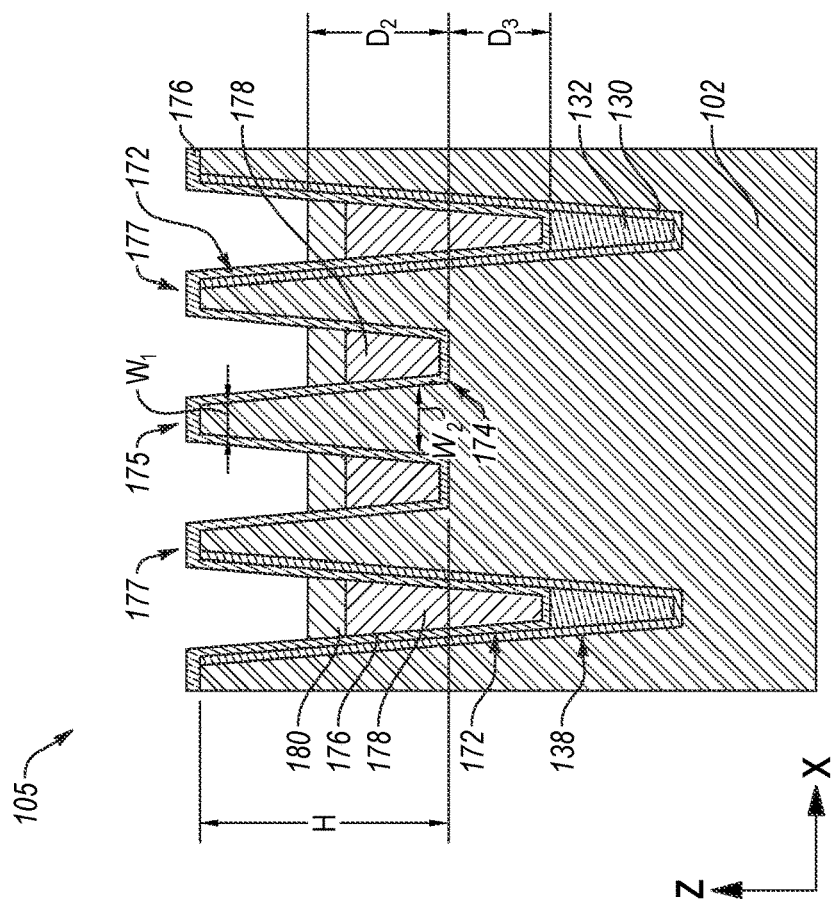
FIG. 1X
FIG. 1W

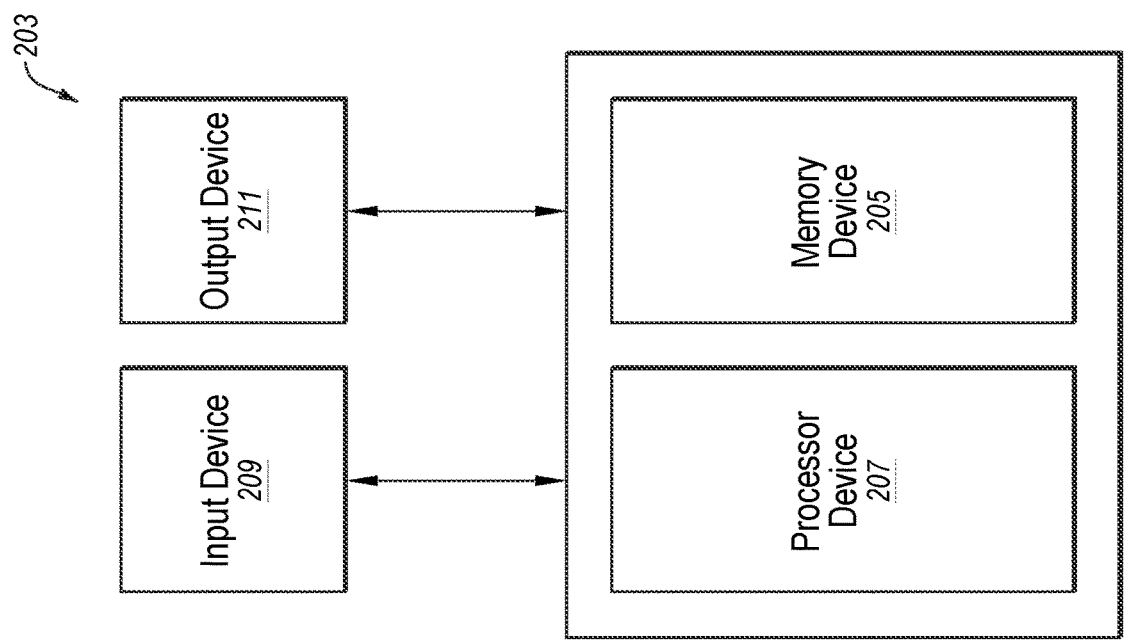

APPARATUSES INCLUDING PASSING WORD LINES COMPRISING A BAND OFFSET MATERIAL, AND RELATED METHODS AND SYSTEMS

TECHNICAL FIELD

Embodiments disclosed herein relate to the field of microelectronic device design and fabrication. More particularly, embodiments of the disclosure relate to apparatuses including a band offset material and isolation structures including an insulative material within passing word lines, and to related methods and systems.

BACKGROUND

Conventional volatile memory cells, such as dynamic random access memory (DRAM) cells, may include a memory storage element and a transistor. The memory storage element may, for example, include a capacitor (e.g., sometimes referred to as a "cell capacitor" or a "storage capacitor") configured to store a logical state (e.g., a binary vale of either a "0" or a "1") defined by the stored charge in the capacitor. The transistor may be referred to in the art as an "access transistor." The transistor conventionally includes a channel region between a pair of source/drain regions and further includes a gate configured to electrically connect the source/drain regions to one another through the channel region. The channel region conventionally includes a semiconductor material, such as silicon.

To charge, discharge, read, or recharge the capacitor, the transistor may be selectively turned to an "on" state, in which current flows between the source region and the drain region through the channel region of the transistor. Application of a voltage greater than a threshold voltage ($V_t$) to the gate induces an inversion layer in the channel region, inducing a current flow between the drain region and the source region. The transistor may be selectively turned to an "off" state, in which the flow of current is substantially stopped.

In the off state, it is desirable for the capacitor associated with the transistor to retain a stored charge, without change (e.g., leakage thereof), through the transistor. However, conventional volatile memory cells may exhibit discharges of current over time and a resulting loss in stored charge. Therefore, even in the "off" state where the source region and the drain region of the associated transistor are electrically isolated (e.g., when an inversion layer is not present in the channel region) and the memory cell is unselected (e.g., not selected), current may leak from the capacitor through the transistor. This off-state current is referred to in the art as sub-threshold leakage current. The undesirable leakage of charge from the capacitor requires the capacitor to be constantly refreshed (e.g., recharged) to maintain the logic state of the memory cell. However, refreshing the charge on the capacitor increases the power consumption of the electronic device associated with the memory cell.

In addition to maintaining a low refresh rate, it is desirable to reduce an amount that an unselected memory cell is disturbed when a voltage is applied to a passing word line (e.g., a word line that is not electrically coupled to the unselected memory cell, but located proximate (e.g., adjacent) to the unselected memory cell). In some instances, application of a voltage to a word line adjacent an unselected memory cell may induce leakage of current or charge from the capacitor associated with the unselected memory cell through the drain of the unselected memory cell. The leakage may increase a required refresh rate of the unselected memory cell and affect performance of the electronic device. For example, when a row (e.g., a word line) is repeatedly activated and refreshed, noise may be injected into the adjacent row (e.g., a victim row), such that data corruption may occur in one or more memory cells in the victim row. The repeated activation and refreshing of the row are referred to as a so-called "row hammer" effect. A so-called "row hammer event" occurs when a refresh command is executed to refresh word lines that are adjacent to a hammered word line. A particular word line is "hammered" when it is accessed via memory access operations, such as an active command, in a manner that potentially leads to data errors in adjacent word lines. Leakage and parasitic currents caused by the hammering of a row may cause data corruption in a non-accessed physically adjacent row (e.g., the victim row).

BRIEF DESCRIPTION OF THE DRAWINGS

FIG. 2 is a block diagram of an electronic system, in accordance with embodiments of the disclosure.

DETAILED DESCRIPTION

Figure 1F:
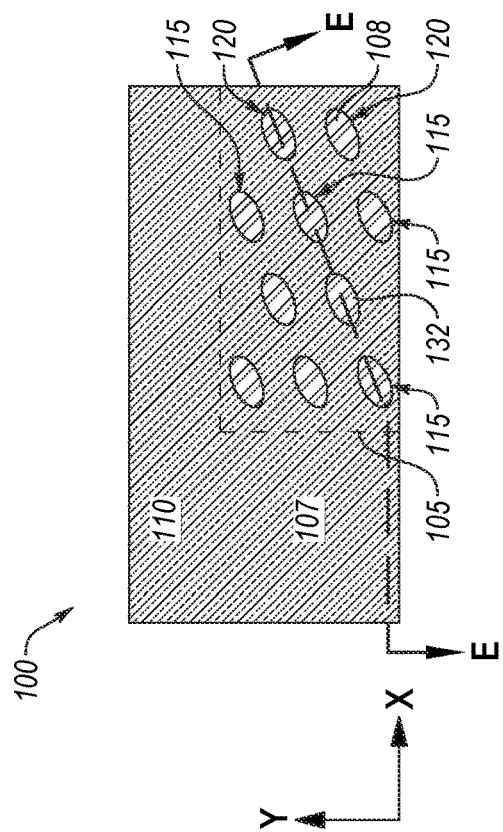
FIGS. 1A through 1X are simplified cross-sectional views (FIGS. 1A, 1C, 1E, 1G through 1J, 1L, 1N through 1P, 1S, 1T, and 1V through 1X) and top-down views (FIGS. 1B, 1D, 1F, 1K, 1M, 1Q, 1R, and 1U) illustrating a method of forming an apparatus, in accordance with embodiments of the disclosure.

An apparatus (e.g., an electronic device, a microelectronic device, a memory device) that includes passing word lines is disclosed. The apparatus comprises active word lines extending within a base material (e.g., a semiconductive material), passing word lines extending adjacent to the active word lines within the semiconductive material, isolation regions adjacent to (e.g., below) the passing word lines, and a band offset material (e.g., a high bandgap material) adjacent to the passing word lines and the isolation regions. The semiconductive material may exhibit a first bandgap and the band offset material may exhibit a second, different bandgap. An interface between the band offset material and the semiconductive material comprises a so-called "heterojunction" in that different materials are present along the interface. Further, the isolation regions (e.g., shallow trench isolation (STI) structures) adjacent to the passing word lines may include an insulative material having a fixed negative charge. A material composition of the insulative material of the STI structures may differ from a material composition of additional materials (e.g., additional insulative materials, dielectric materials) within and overlying the passing word lines and the active word lines. For example, a dielectric material (e.g., a gate dielectric material) adjacent to electrodes (e.g., gate electrodes) of the active word lines and the passing word lines may comprise silicon dioxide. Further, an additional insulative material overlying the electrodes may also comprise silicon dioxide, while the insulative material of the STI structures may be substantially devoid of silicon dioxide. The band offset material in combination with the insulative material of the isolation region may reduce leakage from a storage device (e.g., a capacitor) during the "off" state when an associated memory cell is not selected. The reduction in the charge leakage from the storage device may improve performance of the apparatus, such as by increasing the amount of time between refresh operations of the memory cells associated with the storage devices. By including the band offset material and the insulative material of the isolation region within the passing word lines, the apparatus according to embodiments of the disclosure may utilize less power and operate at higher speeds compared to conventional apparatuses.

The following description provides specific details, such as material types, material thicknesses, and process conditions in order to provide a thorough description of embodiments described herein. However, a person of ordinary skill in the art would understand that the embodiments of the disclosure may be practiced without employing these specific details. Indeed, the embodiments of the disclosure may be practiced in conjunction with conventional apparatus fabrication techniques employed in the industry. In addition, the description provided below does not form a complete process flow for manufacturing an apparatus (e.g., an electronic device, a microelectronic device, a memory device, such as DRAM memory device). The structures described below do not form a complete apparatus. Only those process acts and structures necessary to understand the embodiments of the disclosure are described in detail below. Additional acts to form a complete apparatus from the structures may be performed by conventional fabrication techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, apparatus, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), an electronic device combining logic and memory, or a graphics processing unit (GPU) incorporating memory.

As used herein, the term "conductive material" means and includes an electrically conductive material. The conductive material may include one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, an "insulative structure" means and includes a structure formed of and including at least one insulative material.

As used herein, the phrase "coupled to" refers to structures operatively connected with each other, such as electrically connected through a direct ohmic connection or through an indirect connection (e.g., via another structure).

FIGS. 1A through 1X are simplified partial cross-sectional views and top-down views illustrating embodiments of a method of forming an apparatus 100 (e.g., an electronic device, a memory device, such as a DRAM device), in accordance with embodiments of the disclosure. FIG. 1B is a top-down view of the apparatus 100 at the processing stage shown in FIG. 1A, wherein a line A-A corresponds to the cross-section of the apparatus 100 depicted in FIG. 1A.

With reference to FIGS. 1A and 1B, the apparatus 100 may include a base material 102 (e.g., a semiconductive material), a first oxide material 104 vertically overlying (e.g., in the Z-direction) the base material 102, a first nitride material 106 vertically overlying the first oxide material 104, a first mask material 108 (e.g., a first carbon-containing material) vertically overlying the first nitride material 106, a first dielectric anti-reflective coating (DARC) material 110 vertically overlying the first mask material 108, and a first resist material 112 (e.g., a first photoresist material) vertically overlying the first DARC material 110.

The first resist material 112 may be patterned to include openings 115 therein, with portions of the first DARC material 110 exposed through the openings 115. In some embodiments, the openings 115 are formed in an array region 105 (e.g., active area) of the apparatus 100 and are not formed in a peripheral region 107 of the apparatus 100. The array region 105 may include regions of the apparatus 100 including active circuitry and memory cells (e.g., arrays of memory cells). Although FIG. 1B illustrates only six openings 115 in the array region 105 for ease of understanding the disclosure, it will be understood that the apparatus 100 may include more openings 115 (e.g., thousands of openings 115). The openings 115 may be formed by conducting photolithography and development acts.

The openings 115 may exhibit a substantially elliptical shape, a rectangular shape, or another shape, as best shown in the top-down view. In some embodiments, the openings 115 have an elliptical shape.

The base material 102 may include a semiconductor substrate, a base semiconductor material on a supporting substrate, a metal electrode, or a semiconductor substrate having one or more materials, structures, or regions formed thereon. The base material 102 may be a conventional silicon substrate or other bulk substrate including a semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base material" in the following description, previous process stages may have been utilized to form material, regions, or junctions in the base semiconductor structure or foundation. The base material 102 may include one or more materials associated with integrated circuitry fabrication. Such materials may include, for example, one or more of refractory metals, barrier materials, diffusion materials, and insulative materials. The base material 102 may include, for example, complementary metal oxide semiconductor (CMOS) structures, or other semiconductor structures. Different portions of the base material 102 may be electrically isolated from each other by one or more dielectric materials. The base material 102 may be doped or undoped.

The first oxide material 104 may be formed of and include one or more dielectric materials, such as, for example, one or more of silicon dioxide ($SiO_2$), fluorosilicate glass (FSG), phosphosilicate glass (PSG), borosilicate glass (BSG), borophosphosilicate glass (BPSG), and another insulative material. The first oxide material 104 may be formed by thermal oxidation of the base material 102, deposition (e.g., deposition with, for example, tetraethyl orthosilicate (TEOS)), or another method. In some embodiments, the first oxide material 104 comprises silicon dioxide.

The first nitride material 106 may be formed of and include one or more of silicon nitride ($Si_3N_4$), silicon oxynitride ($SiO_xN_y$), or another material. In some embodiments, the first nitride material 106 comprises silicon nitride.

The first mask material 108 may be formed of and include a carbon-containing mask material. In some embodiments, the first mask material 108 comprises amorphous hydrogenated carbon (also referred to as "amorphous carbon"). In some embodiments, the first mask material 108 comprises a spin-on carbon (SOC) material.

The first DARC material 110 may be formed of and include a silicon oxynitride material, such as $Si_xO_yN_z$, wherein x is between about 10 and about 60, y is between about 20 and about 50, and z is between about 10 and about 20. However, the disclosure is not so limited and the first DARC material 110 may include other suitable DARC materials that may be known in the art. The first DARC material 110 may be formulated and configured to substantially prevent reflection of electromagnetic radiation (e.g., a light source) during exposure of a photoresist material (e.g., the first resist material 112) during patterning of the photoresist material.

The first resist material 112 may be formed of and include a 193 nanometer (nm) photoresist material, a 248 nm photoresist material, or a photoresist material sensitive to radiation of a different wavelength. The first resist material 112 may be a positive or a negative photoresist material, a photopolymeric photoresist material, a photodecomposing photoresist material, or a photocrosslinking photoresist material. Photoresist materials, such as positive and negative resists, are known in the art and, therefore, are not described in detail herein. As discussed above, the openings 115 may be formed within the first resist material 112 within the array region 105.

With reference to FIGS. 1C and 1D, the openings 115 may be transferred to the first DARC material 110, followed by removal of the first resist material 112 (FIG. 1A). FIG. 1D is a top-down view of the apparatus 100 at the processing stage shown in FIG. 1C, wherein a line C-C corresponds to the cross-section of the apparatus 100 depicted in FIG. 1C. After removing the first resist material 112, a second mask material 114 (e.g., a second carbon-containing material) may be formed over the first DARC material 110 and a second DARC material 116 may be formed over the second mask material 114. The second mask material 114 may substantially fill the openings 115 (FIG. 1A) within the first DARC material 110.

The second mask material 114 may be formed of and include one or more of the materials described above with reference to the first mask material 108 and the second DARC material 116 may be formed of and include one or more of the materials described above with reference to the first DARC material 110. In some embodiments, the second mask material 114 comprises the same material composition as the first mask material 108. In some embodiments, the second DARC material 116 comprises the same material composition as the first DARC material 110.

A second resist material 118 (e.g., a second photoresist material) may be formed over the second DARC material 116. The second resist material 118 may include one or more of the materials described above with reference to the first resist material 112. In some embodiments, the second resist material 118 comprises the same material composition as the first resist material 112.

Openings 120 may be formed in the second resist material 118 to expose a portion of the second DARC material 116. The openings 120 may be formed in the array region 105 and may not be formed in the peripheral region 107. In some embodiments, the openings 120 are laterally offset (e.g., in the X-direction and in the Y-direction) from the openings 115 (FIG. 1B).

Figure 1E:
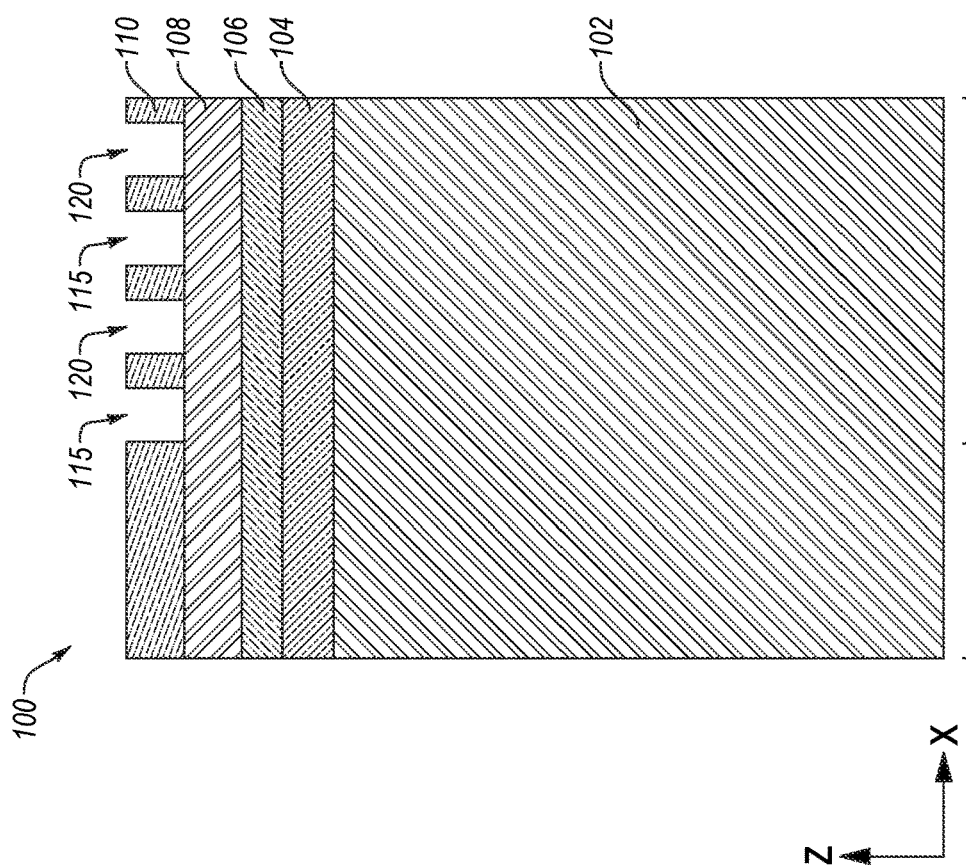

Referring now to FIGS. 1E and 1F, the openings 120 in the second resist material 118 may be transferred to the second DARC material 116 and the second resist material 118 may be removed (e.g., stripped) from the second DARC material 116. FIG. 1F is a top-down view of the apparatus 100 at the processing stage shown in FIG. 1E, wherein a line E-E corresponds to the cross-section of the apparatus 100 depicted in FIG. 1E. After forming the openings 120 in the second DARC material 116, the openings 120 may be transferred to the second mask material 114. For example, the openings 120 may be formed in the second mask material 114 by exposing the second mask material 114 to a plasma etch including one or more of HBr, Cl$_2$, carbon tetrafluoride (CF$_4$), or another material.

With continued reference to FIG. 1E, after forming the openings 120 in the second mask material 114 (FIG. 1C), the pattern of the openings 120 may be transferred from the second mask material 114 to the first DARC material 110 and the second mask material 114 may be removed. Accordingly, the first DARC material 110 may include the openings 115 and the openings 120, which may be laterally offset (e.g., in the X-direction and in the Y-direction) from one another, as illustrated in FIG. 1F, which is a top-down view of the apparatus 100 of FIG. 1E. With reference to FIG. 1E, the openings 115 may be aligned with other openings 115 in the lateral direction (e.g., in each of the X-direction and the Z-direction) and may be laterally offset (e.g., in each of the X-direction and the Y-direction) from each of the openings 120. Similarly, the openings 120 may be aligned with other openings 120 in the lateral direction (e.g., in each of the X-direction and the Z-direction) and may be laterally offset (e.g., in each of the X-direction and the Y-direction) from each of the openings 115. One or more openings 115 may laterally intervene (e.g., in the X-direction, in the Y-direction) between adjacent ones of the openings 120 and one or more openings 120 may laterally intervene (e.g., in the X-direction, in the Y-direction) between adjacent ones of the openings 115.

Although FIGS. 1E and 1F illustrate a particular spacing between adjacent openings 115, 120, the disclosure is not so limited. It will be understood that the spacing between the openings 115, 120 may be different than (e.g., greater than) that illustrated, but, for ease of understanding the description the openings 115, 120 are illustrated with a particular spacing.

Figure 1H:
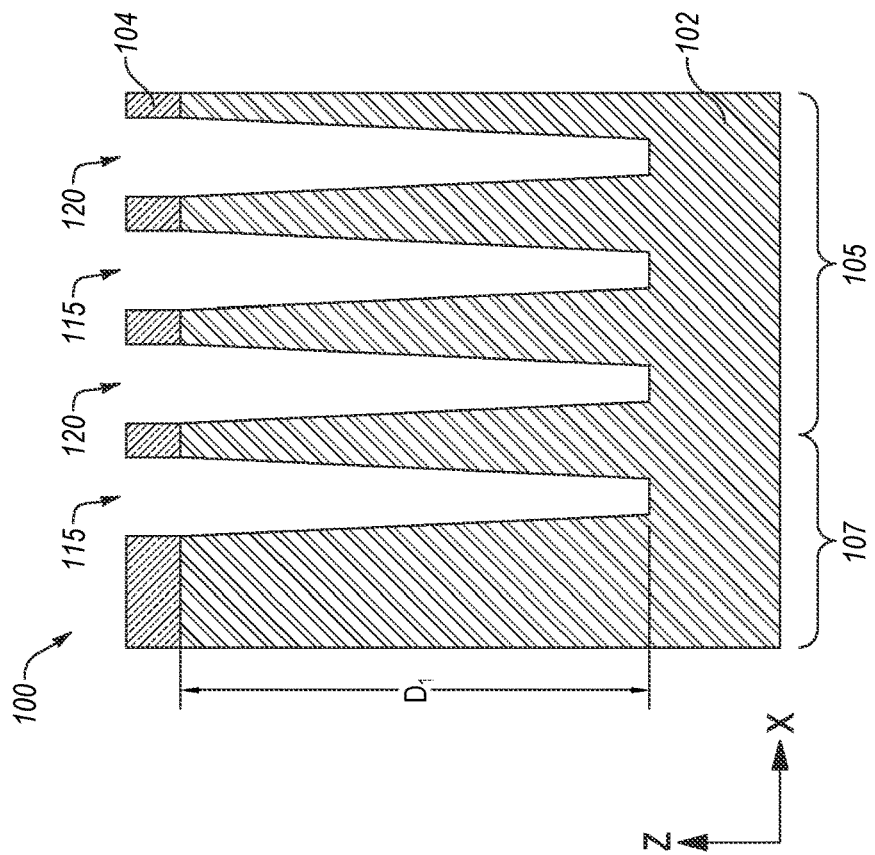
Figure 1G:
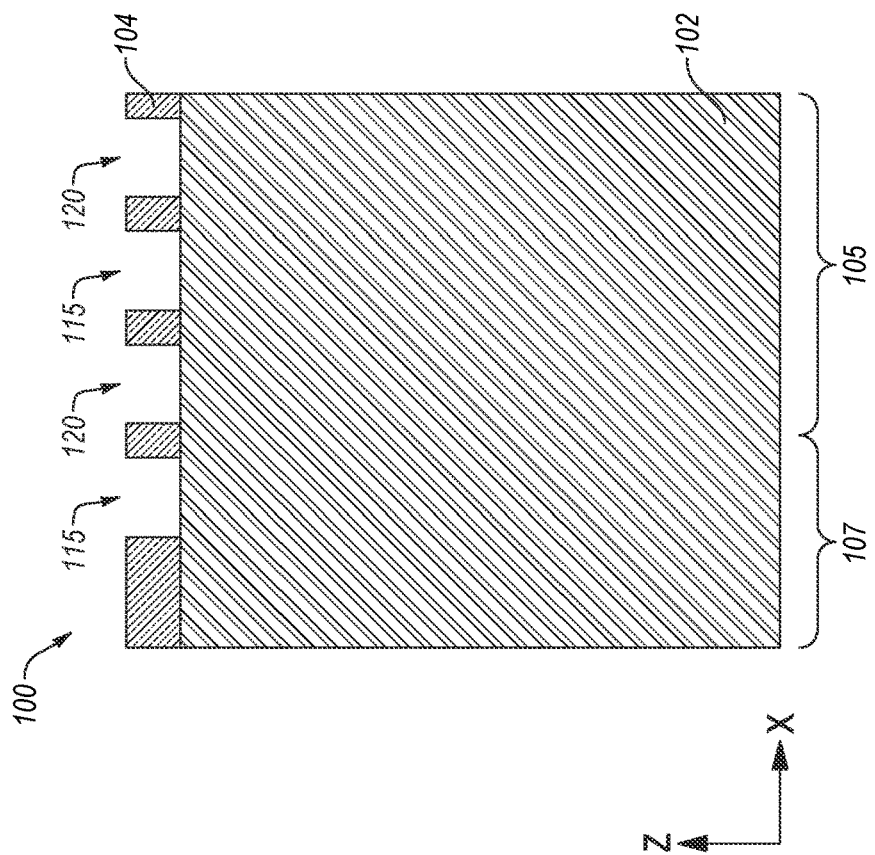

FIG. 1G illustrates the same cross-sectional view of the apparatus 100 as that illustrated in FIG. 1E. With reference to FIG. 1G, the pattern of openings 115, 120 within the first DARC material 110 (FIG. 1E) may be transferred to the first oxide material 104. For example, the openings 115, 120 may be formed through the first mask material 108 (FIG. 1E). In some embodiments, the first DARC material 110 is removed after forming the openings 115, 120 in the first mask material 108. The openings 115, 120 may be transferred through the first nitride material 106 (FIG. 1E) and subsequently transferred to the first oxide material 104, as illustrated in FIG. 1G. With reference to FIG. 1G, portions of the base material 102 may be exposed though the openings 115, 120 in the first oxide material 104.

With reference to FIG. 1H, which illustrates the same cross-section illustrated in FIG. 1G, the base material 102 may be patterned through the openings 115, 120 in the first oxide material 104 to extend the openings 115, 120 into the base material 102. By way of non-limiting example, the openings 115, 120 may be formed in the base material 102 by exposing the base material 102 to a wet etchant, such as one or more of potassium hydroxide (KOH), sodium hydroxide (NaOH), tetramethylammonium hydroxide (TMAH), or another material. In some embodiments, the base material 102 is anisotropically etched to form the openings 115, 120 therein. The openings 115, 120 in the base material 102 may correspond to STI trenches, in which the STI structures are formed.

A depth $D_1$ of the openings 115, 120 into the base material 102 may be within a range from about 100 nm to about 180 nm, such as from about 100 nm to about 120 nm, from about 120 nm to about 140 nm, from about 140 nm to about 160 nm, or from about 160 nm to about 180 nm. However, the disclosure is not so limited and the depth $D_1$ may be different than those described above.

Figure 1I:
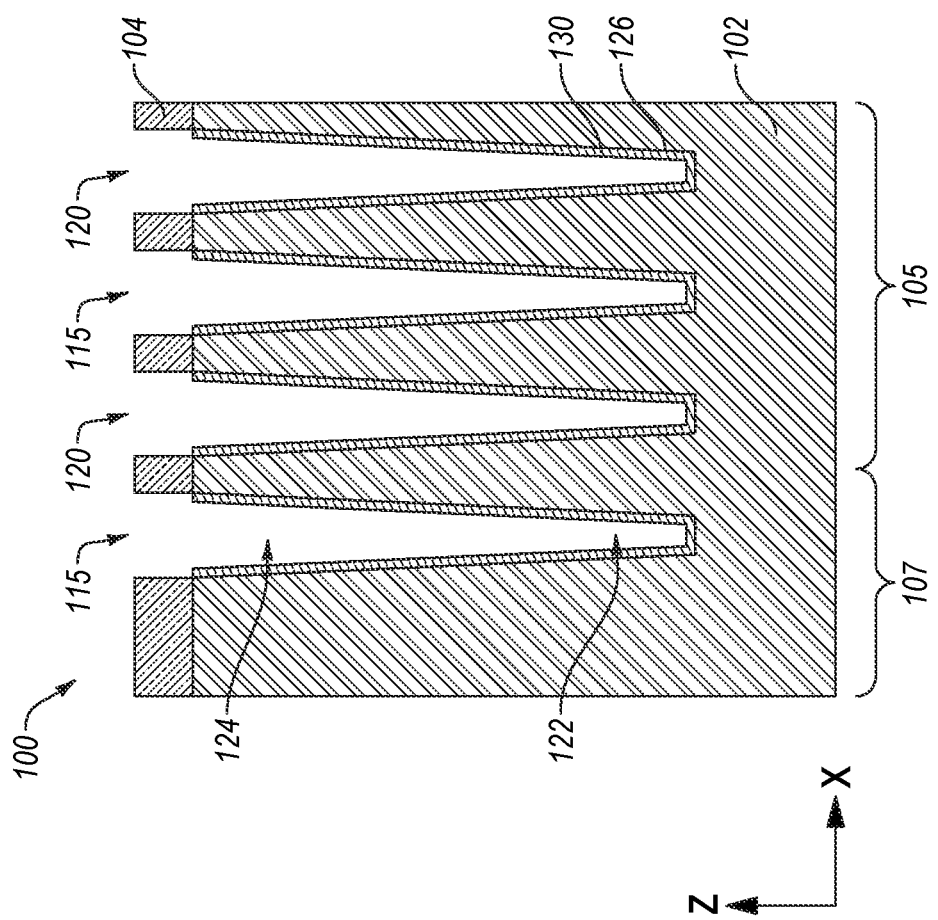

FIG. 1I illustrates the same cross-section of the apparatus 100 as FIG. 1H. Referring to FIG. 1I, a band offset material 130, such as a high bandgap ("HBG") material, may be formed over (e.g., directly on) exposed surfaces (e.g., exposed upper surfaces, exposed side surfaces) of the base material 102. The band offset material 130 may be formed within lower regions 122 and upper regions 124 of the openings 115, 120 without substantially completely filling the openings 115, 120. The bandgap offset material 130 is present in only a portion of the active area of the apparatus 100. In other words, the active area is not substantially completely covered by the bandgap offset material 130 and remaining portions of the active area include the base material 102 (e.g., silicon). By way of non-limiting example, a thickness of the band offset material 130 may be within a range from about 2 nm to about 10 nm, such as from about 3 nm to about 6 nm. The band offset material 130 may be formed by a conformal deposition process, such as CVD or ALD. The band offset material 130 may alternatively be formed by epitaxial growth. If the band offset material 130 is epitaxially grown, a mask may not be utilized to selectively form the band offset material 130 on the base material 102. The process utilized to form the band offset material 130 adjacent to the base material 102 may at least partially depend on the material properties of the band offset material 130 and the base material 102, and may affect the number (e.g., density) of defects present in the band offset material 130. In some embodiments, the band offset material 130 is epitaxially grown on the base material 102. The band offset material 130 may not be formed on (e.g., grown on) exposed portions of the first oxide material 104.

The band offset material 130 may directly contact the base material 102 along a vertical extent (e.g., a height) of the openings 115, 120 in the base material 102 such that upper surfaces of the base material 102 and the band offset material 130 are substantially coplanar with one another. In other words, the band offset material 130 may include continuous portions thereof extending along exposed surfaces of the base material 102, such as on side surfaces and lower surfaces of the base material 102. The band offset material 130 may be in direct contact with and may be bonded to the base material 102 along an interface 126. The interface 126 may define a so-called "heterojunction" since the material compositions of the band offset material 130 and the base material 102 are different and/or exhibit one or more of different dopant concentrations and different dopant distributions. As such, the band offset material 130 and the base material 102 may exhibit different (e.g., unequal) bandgaps than one another. One of ordinary skill in the art will appreciate that the heterojunction nature of the interface 126 may be based on the adjacent regions of the interface 126 having one or more of differing material compositions, differing dopant species, differing dopant concentrations, and differing dopant distributions resulting in a so-called "heterostructure."

The base material 102 may be, or include, a material that exhibits a room temperature bandgap of less than or equal to about 1.4 eV, such as within a range of from about 0.4 eV to about 0.85 eV, from about 0.85 eV to about 1.12 eV, or from about 1.12 eV to about 1.4 eV. By way of example and not limitation, the base material 102 may comprise one or more of polycrystalline silicon (also known as "polysilicon,"

which exhibits a room temperature bandgap of about 1.12 eV), silicon germanium (which exhibits a room temperature bandgap of about 0.85 eV), germanium (which exhibits a room temperature bandgap of about 0.66 eV), and indium gallium arsenide (which exhibits a room temperature bandgap of about 0.7 eV).

The band offset material 130 may be, or include, a material that exhibits a room temperature bandgap of higher than about 1.5 eV, such as within a range of from about 1.5 eV to about 3.0 eV or from about 3.0 eV to about 4.0 eV. A bandgap of the band offset material 130 may be different than (e.g., relatively higher than) a bandgap of the base material 102. By way of non-limiting example, a bandgap of the base material 102 may be about 1.12 eV and a bandgap of the band offset material 130 may be between about 3.5 eV and about 3.9 eV (e.g., about 3.7 eV). The band offset material 130 may also exhibit a high electron mobility. As used herein, "high mobility" means and includes an electron mobility substantially equal to or greater than about 5 $cm^2/V \cdot s$, such as within a range of from about 5 $cm^2/V \cdot s$ to about 10 $cm^2/V \cdot s$, from about 10 $cm^2/V \cdot s$ to about 15 $cm^2/V \cdot s$, or from about 15 $cm^2/V \cdot s$ to about 50 $cm^2/V \cdot s$. Therefore, the band offset material 130 may exhibit a relatively higher electron mobility than an electron mobility of the base material 102 (e.g., polysilicon, which has an electron mobility of from about 5 $cm^2/V \cdot s$ to about 15 $cm^2/V \cdot s$). The base material 102 may be undoped or may include a p-type dopant or an n-type dopant, and the band offset material 130 may or may not be doped with at least one dopant.

The band offset material 130 may be formed of and include one or more high bandgap materials including, for example, aluminum arsenide (AlAs), aluminum nitride (AlN), copper sulfide (CuS), gallium arsenide (GaAs), gallium nitride (GaN), gallium phosphide (GaP), gallium phosphate ($GaPO_4$), indium aluminum arsenide (InAlAs), zinc oxide (ZnO), and zinc sulfide (ZnS). However, the disclosure is not so limited and other materials that exhibit the room temperature bandgap and electron mobility described above may be used as the band offset material 130. The band offset material 130 may also exhibit a crystalline form that is substantially lattice-matched to a crystalline form of the base material 102. That is, as the band offset material 130 is formed, at least some of the band offset material 130 may exhibit the same crystalline structure as the portion of the base material 102 over which it is formed. The base material 102 may, thus, function as a template upon which the band offset material 130 is formed. The band offset material 130 may be selected such that a lattice constant is within about ±5% (e.g., within about ±2%) of a multiple of the lattice constant or bond length of that of the base material 102. Non-limiting examples of materials of the band offset material 130 having lattice constants within about ±5% of a multiple of the bond length of silicon include aluminum arsenide, gallium arsenide, gallium phosphide, and zinc sulfide. The band offset material 130 may be selected, at least in part, to withstand high-temperature conditions during processing of the apparatus 100. In some embodiments, the base material 102 comprises polysilicon and the band offset material 130 comprises zinc sulfide epitaxially grown on portions of the base material 102. In other embodiments, the base material 102 comprises silicon-germanium (SiGe) and the band offset material 130 comprises gallium arsenide.

Forming the band offset material 130 from a material that exhibits a room temperature bandgap of higher than about 1.5 eV (e.g., about 3.7 eV) may reduce leakage of charge during the "off" state of the apparatus 100 when a memory cell is not selected compared to only using a single semiconductive material (e.g., the base material 102) exhibiting a bandgap of smaller than about 1.4 eV (e.g., about 1.12 eV). Further, forming the band offset material 130 from a material exhibiting a similar lattice constant to the base material 102 may significantly reduce defects than if a lattice constant of the band offset material 130 is not matched (e.g., mismatched) with that of the base material 102. Without being bound by any theory, it is believed that the lattice match between the band offset material 130 and the base material 102 reduces defects in the resulting apparatus 100. For instance, if the band offset material 130 exhibiting a differing lattice constant than that of the base material 102 (e.g., a silicon-based substrate) by greater than about ±5% (e.g., within about ±2%), the resulting materials would be of lower quality (e.g., include a greater number of defects) that could affect performance of the apparatus during use and operation.

With reference to FIGS. 1J and 1K, an insulative material 132 may be formed within the openings 115, 120 (FIG. 1I) and may substantially fill remaining regions (e.g., central regions) of the openings 115, 120 to form isolation structures 138 (e.g., isolation regions, insulative structures) extending into the base material 102. The insulative material 132 may be formed within the lower regions 122 and the upper regions 124 of the openings 115, 120. The insulative material 132 includes lower portions 134 laterally adjacent to the band offset material 130 within the openings 115, 120 and upper portions 136 laterally adjacent to the first oxide material 104. In other words, the lower portions 134 of the insulative material 132 extend from the upper surface of the base material 102 to the band offset material 130 vertically underlying (e.g., in the Z-direction) the insulative material 132, and the upper portions 136 of the insulative material 132 are located above the upper surface of the base material 102. As shown in FIG. 1J, the lower portions 134 of the insulative material 132 are laterally adjacent to the band offset material 130 such that the insulative material 132 is laterally separated from the base material 102 by the band offset material 130. For convenience, the lower portions 134 and the upper portions 136 are shown in the drawings as separate portions of the insulative material 132, although it is understood that the insulative material 132 may include a continuous portion of one or more (e.g., a single) material. After forming the insulative material 132, the apparatus 100 may be exposed to a chemical mechanical planarization (CMP) process to remove any insulative material 132 from portions outside of the openings 115, 120. FIG. 1K is a top-down view of the apparatus 100 at the processing stage shown in FIG. 1J, wherein a line J-J corresponds to the cross-section of the apparatus 100 depicted in FIG. 1J.

The insulative material 132 may be formed of and include a dielectric material including, for example, aluminum oxide, gadolinium oxide, hafnium oxide, zirconium oxide, niobium oxide, tantalum oxide, titanium oxide, gallium oxide, aluminum zinc oxide, zinc gallium oxide, hafnium aluminum oxide, zirconium aluminum oxide, hafnium silicate, zirconium silicate, or a combination thereof. However, the disclosure is not so limited and other materials, or combinations of materials, may be used as the insulative material 132. For example, the insulative material 132 may include materials having a fixed negative charge. Forming the insulative material 132 from a material having the fixed negative charge may further reduce current leakage during an "off" state when the memory cell is not selected, which may result in an increased threshold voltage $V_t$ during operation of a resulting apparatus 100 compared to using a material (e.g., a silicon oxide material) having a fixed positive charge. Accordingly, the isolation structures 138 are substantially devoid (e.g., substantially free) of silicon dioxide. In some embodiments, the insulative material 132 comprises aluminum oxide or hafnium dioxide.

The isolation structures 138 may include a shallow trench isolation (STI) structure including the lower portions 134 of the insulative material 132 extending from the upper surface of the base material 102 within the openings 115, 120. In some embodiments, sidewalls of the isolation structures 138 may be tapered. For example, an upper portion of the isolation structures 138 may have a larger cross-sectional area than a lower portion of the isolation structures 138.

FIG. 1M is a top-down view of the apparatus 100 at the processing stage shown in FIG. 1L, wherein a line L-L corresponds to the cross-section of the apparatus 100 depicted in FIG. 1L. With reference to FIG. 1L, since the cross-section of FIG. 1L is taken through the X-Z plane, it will be understood that the spacing between adjacent isolation structures 138 may be different than that illustrated in the cross-section of FIG. 1J.

With reference to FIG. 1L, a second nitride material 140 may be formed vertically over (e.g., in the Z-direction) the first oxide material 104, a third mask material 142 (e.g., a third carbon-containing material) may be formed vertically over the second nitride material 140, a third DARC material 144 may be formed vertically over the third mask material 142, a second oxide material 146 may be formed vertically over the third DARC material 144, a polysilicon material 148 may be formed vertically over the second oxide material 146, a fourth mask material 150 (e.g., a fourth carbon-containing material) may be formed vertically over the polysilicon material 148, and a fourth DARC material 152 may be formed vertically over the fourth mask material 150.

The second nitride material 140 may be formed of and include one or more of the materials described above with reference to the first nitride material 106 (FIG. 1A). In some embodiments, the second nitride material 140 comprises silicon nitride.

The third mask material 142 and the fourth mask material 150 may each individually be formed of and include one or more of the materials described above with reference to the first mask material 108 (FIG. 1A). In some embodiments, the third mask material 142 and the fourth mask material 150 each comprise amorphous carbon. In some embodiments, the third mask material 142 comprises the same material composition as the fourth mask material 150.

The third DARC material 144 and the fourth DARC material 152 may each individually be formed of and include one or more of the materials described above with reference to the first DARC material 110 (FIG. 1A). In some embodiments, the third DARC material 144 and the fourth DARC material 152 each comprise silicon oxynitride. In some embodiments, the third DARC material 144 comprises the same material composition as the fourth DARC material 152.

The second oxide material 146 may be formed of and include one or more of the materials described above with reference to the first oxide material 104. In some embodiments, the second oxide material 146 comprises silicon dioxide. In some embodiments, the second oxide material 146 comprises the same material composition as the first oxide material 104.

With continued reference to FIGS. 1L and 1M, a third resist material 154 (e.g., a third photoresist material) may be formed vertically over (e.g., in the Z-direction) the fourth DARC material 152 and patterned. The third resist material 154 may be formed of and include one or more of the materials described above with reference to the first resist material 112 (FIG. 1A).

With reference to FIG. 1M, the third resist material 154 may be patterned into lines 156, each of which may be separated from one or more adjacent lines 156 by spaces 158. The lines 156 of the third resist material 154 may extend at an angle with reference to the X-axis and the Y-axis. For example, the lines 156 may extend at an angle within a range from about 30° to about 60° with respect to the X-axis. However, the disclosure is not so limited and the lines 156 may extend at an angle with respect to the X-axis different than those described above.

Figure 1N:
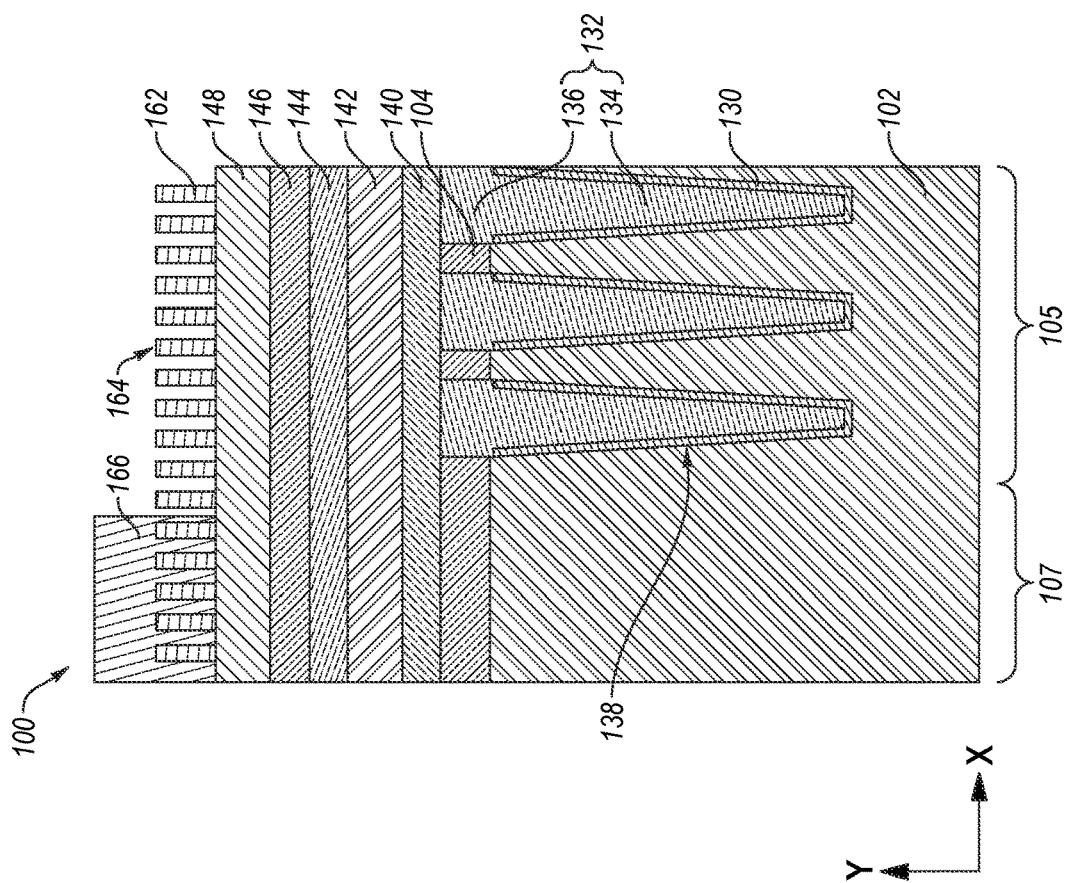

Referring now to FIG. 1N, the pattern of the lines 156 (FIG. 1M) of the third resist material 154 (FIGS. 1N, 1M) may be exposed to a pitch doubling process to form a pattern of lines 160 of the fourth mask material 150. By way of non-limiting example, spacers may be formed on sidewalls of the lines 156 of the third resist material 154 and the third resist material 154 may be removed (e.g., stripped) from surfaces of the fourth mask material 150. The spacers may be used as a mask to pattern the fourth mask material 150, as illustrated in FIG. 1N.

Figure 1O:
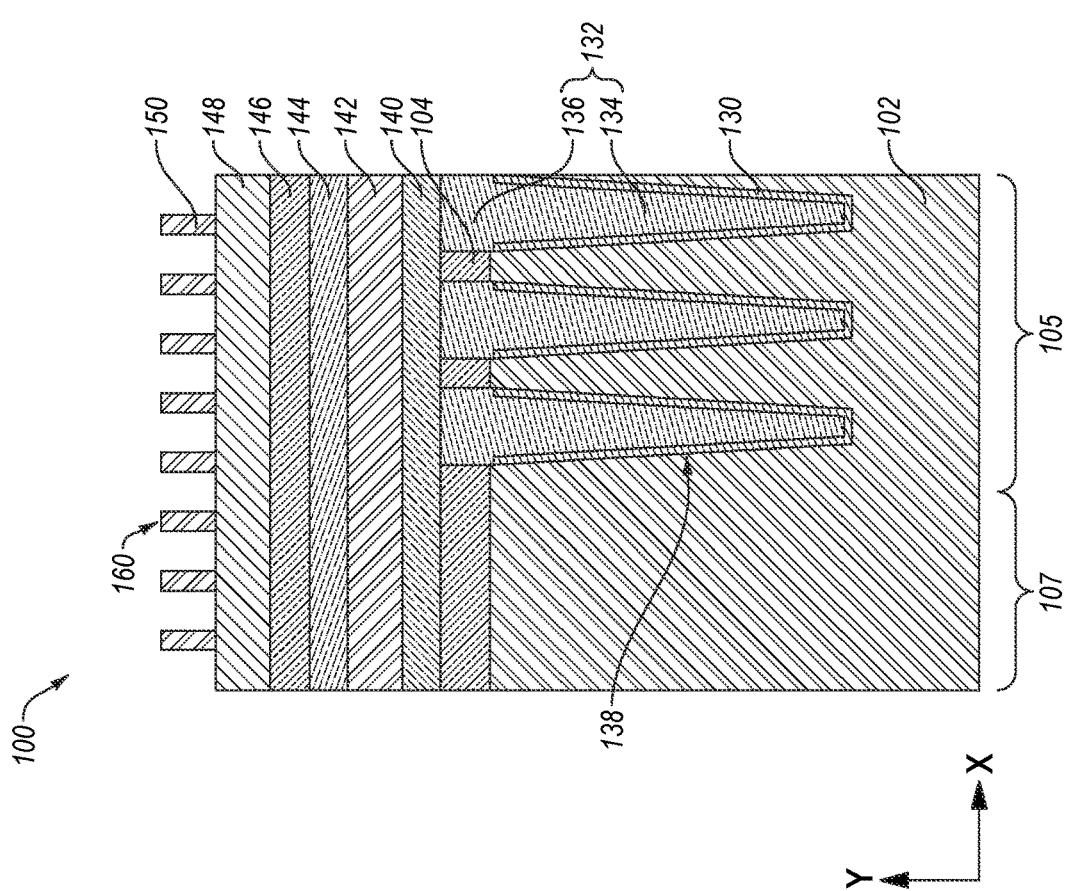

With reference to FIG. 1O, the lines 160 (FIG. 1N) of the fourth mask material 150 (FIG. 1N) may be exposed to another pitch doubling process to form lines 164 of a third oxide material 162. For example, spacers comprising the third oxide material 162 may be formed on sidewalls of the lines 160 of the fourth mask material 150 and the lines 160 of the fourth mask material 150 may be selectively removed relative to the lines 164 of the third oxide material 162. After forming the lines 164 of the third oxide material 162, a fourth resist material 166 (e.g., a fourth photoresist material) may be formed over the peripheral region 107 of the apparatus 100 and the lines 164 of the third oxide material 162 may remain exposed in the array region 105.

Figures 1P, 1Q:
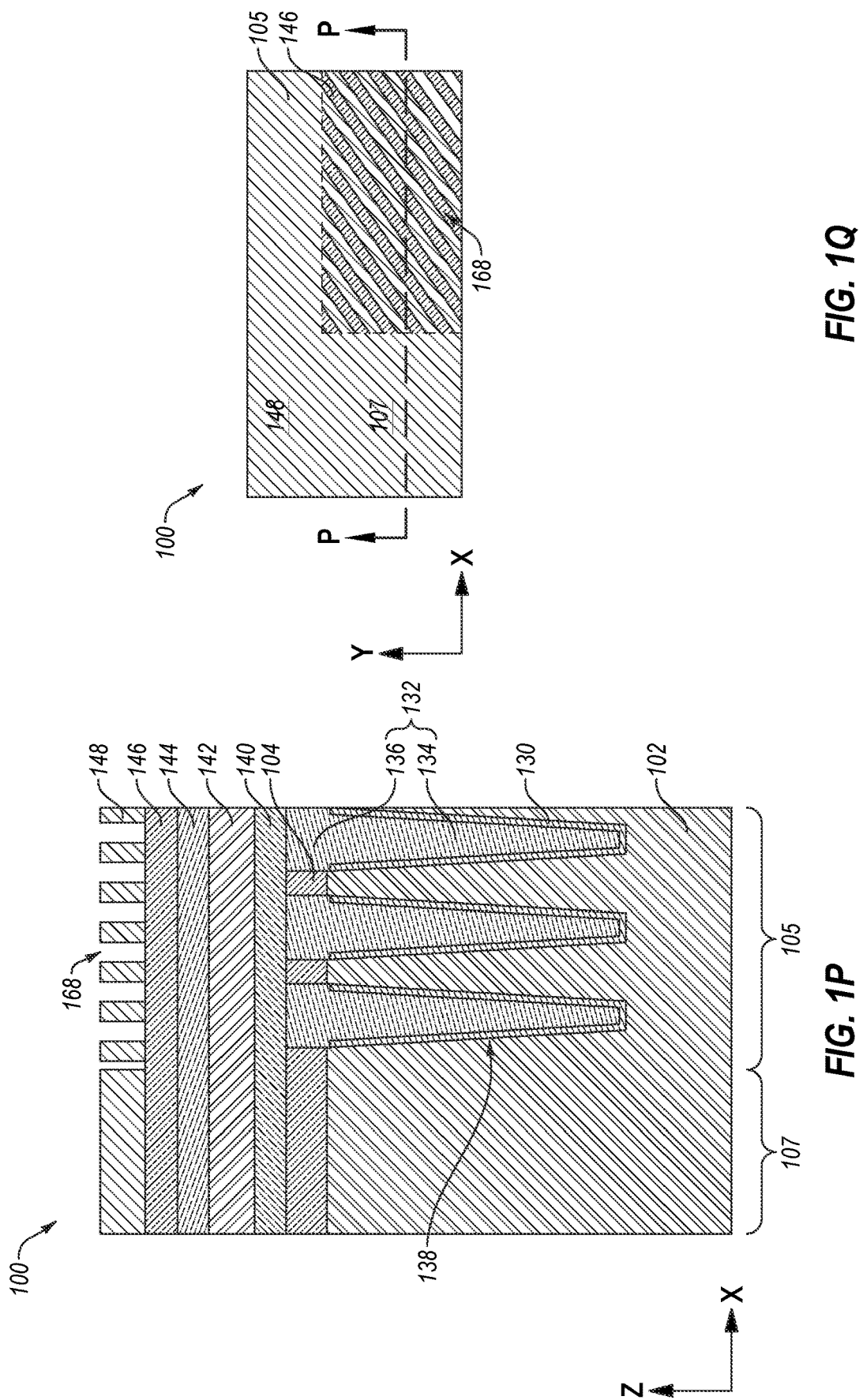

With reference to FIGS. 1P and 1Q, the pattern of lines 164 (FIG. 1O) of the third oxide material 162 (FIG. 1O) may be transferred to the polysilicon material 148 to form lines 168 of the polysilicon material 148. FIG. 1Q is a top-down view of the apparatus 100 at the processing stage shown in FIG. 1P, wherein a line P-P corresponds to the cross-section of the apparatus 100 depicted in FIG. 1P. The lines 168 of the polysilicon material 148 may be formed by, for example, exposing the polysilicon material 148 to one or more dry etchants, such as, for example, one or more of $Cl_2$, $HBr$, $O_2$, $_4C_2F_6$, carbon tetrafluoride ($_4CF_4$), or another material.

Figure 1T:
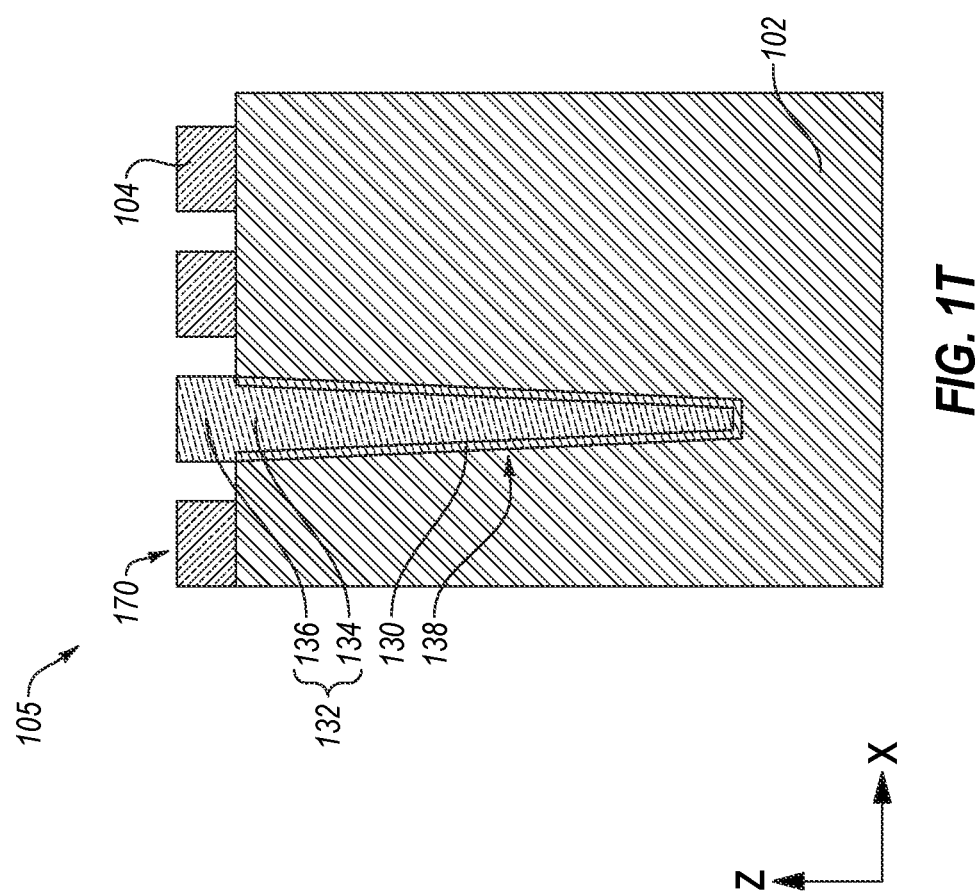

FIG. 1R is a simplified top-down view of a portion of the array region 105 after transferring the pattern of the lines 168 (FIGS. 1P, 1Q) of the polysilicon material 148 (FIGS. 1P, 1Q) to the first oxide material 104. FIG. 1R is a top-down view of the apparatus 100 at the processing stage shown in FIGS. 1S and 1T, wherein a line S-S corresponds to the cross-section of the apparatus 100 of FIG. 1S depicted in FIG. 1R and a line T-T corresponds to the cross-section of the apparatus 100 of FIG. 1T depicted in FIG. 1R. For ease of understand of the description, only a portion of the array region 105 is illustrated in FIGS. 1R through 1T.

Transferring the pattern of the lines 168 (FIGS. 1P, 1Q) of the polysilicon material 148 (FIGS. 1P, 1Q) to the first oxide material 104 may include forming lines 170 of the first oxide material 104 extending between the isolation structures 138. In other words, the lines 170 including remaining portions of the first oxide material 104 may extend in at least one horizontal direction (e.g., the Y-direction), as best shown in FIG. 1T. The upper portions 136 of the insulative material 132 and first oxide material 104 may be removed from regions in between adjacent lines 170 of the first oxide material 104 to expose the base material 102. By way of non-limiting example, the pattern of the lines 168 may be transferred to the second oxide material 146, followed by removal of the polysilicon material 148. Thereafter, the pattern may be transferred from the second oxide material 146 to the second nitride material 140, as known in the art. The pattern may subsequently be transferred from the second nitride material 140 to the first oxide material 104. For example, the pattern of the second nitride material 140 may be used as a mask while patterning the first oxide material 104. Methods of transferring a pattern are known in the art and are not described in detail herein.

Figure 1V:
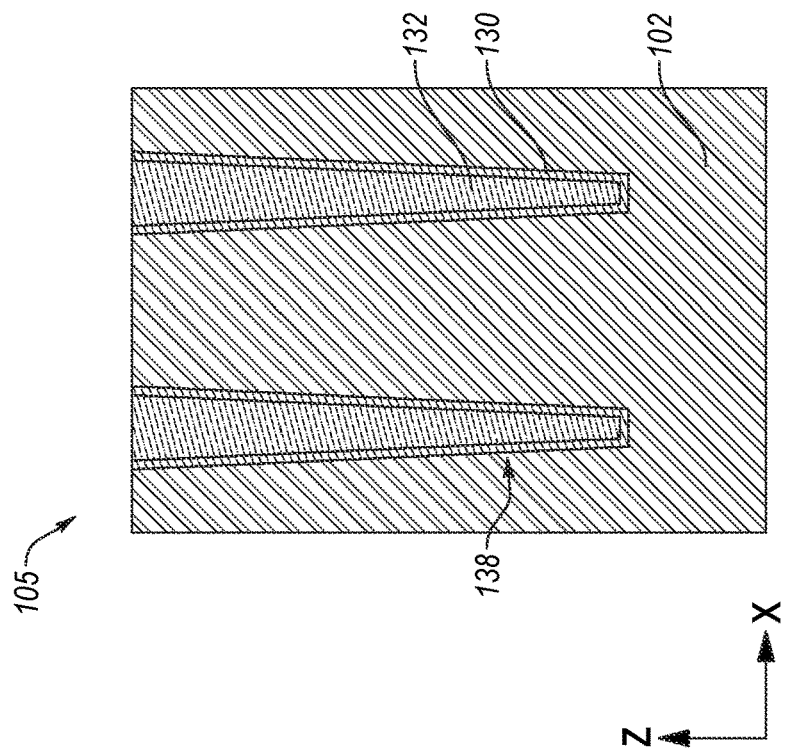
Figure 1U:
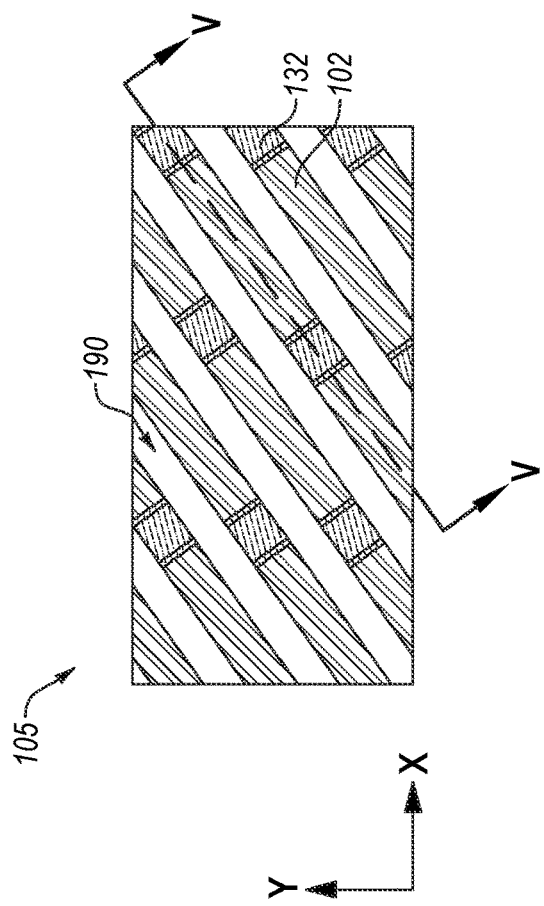

FIG. 1U is a top-down view of the array region 105 after removing the first oxide material 104 (FIG. 1R) and removing at least a portion of the base material 102 between adjacent lines 170 (FIG. 1R) of the first oxide material 104 to form trenches 190 in the base material 102. For example, from about 250 nm to about 300 nm of the base material 102 may be removed between adjacent lines 170. It will be understood that lower portions of the trenches 190 may be defined by the base material 102, but the base material 102 is not illustrated under the trenches 190 in the view of FIG. 1U for ease of understanding the description. FIG. 1U is a top-down view of the apparatus 100 at the processing stage shown in FIG. 1V, wherein a line V-V corresponds to the cross-section of the apparatus 100 depicted in FIG. 1V. Removal of the first oxide material 104 may expose the base material 102 and a portion of the isolation structures 138.

Referring now to FIG. 1W, the apparatus 100 may be exposed to various fabrication acts to form the apparatus 100 of FIG. 1W. The cross-sectional view of FIG. 1W illustrates the same cross-section of the apparatus 100 as that illustrated in FIG. 1V. For example, the isolation structures 138 may be patterned to form passing word lines 172 and the base material 102 between adjacent isolation structures 138 may be patterned to form active word lines 174.

The passing word lines 172 and the active word lines 174 may be formed by, for example, removing portions (e.g., upper portions) of the insulative material 132 of the isolation structures 138 and removing portions of the base material 102 between adjacent isolation structures 138. Recessing the insulative material 132 may including removing portions of the insulative material 132 from the upper regions 124 (FIG. 1I) of the openings 115, 120 (FIG. 1I) without removing portions of the insulative material 132 located within the lower regions 122 (FIG. 1I) of the openings 115, 120. The portions of the base material 102 may be removed concurrently with recessing the insulative material 132. In some embodiments, the insulative material 132 is removed at a faster rate than the base material 102. A depth of the remaining portions of the insulative material 132 may be within a range from about 10 nm to about 40 nm, such as from about 10 nm to about 20 nm, from about 20 nm to about 30 nm, or from about 30 nm to about 40 nm. In some such embodiments, a depth of the passing word lines 172 may be greater than a depth of the active word lines 174. In some embodiments, a portion of the band offset material 130 of the passing word line 172 may be removed. Since the band offset material 130 is formed within the openings 115, 120 (FIG. 1I) in the base material 102 prior to forming the active word lines 174, the band offset material 130 may not be formed within the active word lines 174.

As shown in FIG. 1W, a depth of the passing word lines 172 is greater than a depth $D_2$ of the active word lines 174. The depth $D_2$ of the active word lines 174 may be within a range from about 40 nm to about 90 nm, such as from about 40 nm to about 50 nm, from about 50 nm to about 70 nm, or from about 70 nm to about 90 nm. A depth $D_3$ of the passing word line 172 that extends below a lower portion of the active word lines 174 may be within a range from about 5 nm to about 35 nm, such as from about 5 nm to about 15 nm, from about 15 nm to about 25 nm, or from about 25 nm to about 35 nm. However, the disclosure is not so limited and the depths $D_2$, $D_3$ may be different than those described.

Removing portions of the base material 102 between adjacent isolation structures 138 during formation of the passing word lines 172 and the active word lines 174 may include forming pillars extending from the base material 102. For example, the pillars may include first pillars 175 between the active word lines 174 and second pillars 177 located adjacent to a passing word line 172 (e.g., between a passing word line 172 and an active word line 174).

The first pillars 175 and the second pillars 177 may each individually comprise the same material composition as the base material 102. In some embodiments, at least a portion of the first pillars 175 and the second pillars 177 comprises one or more dopants. By way of non-limiting example, the first pillars 175 may comprise a source region of a transistor and the second pillars 177 may comprise a drain region of a transistor. The first pillars 175 may be doped with at least one n-type dopant (e.g., arsenic ions, phosphorous ions, antimony ions) and the second pillars 177 may be doped with at least one p-type dopant (e.g., boron ions). Alternatively, portions of each of the first pillars 175 and the second pillars 177 may be doped with at least one n-type dopant.

A height H of the first pillars 175 and the second pillars 177 may be within a range from about 100 nm to about 150 nm, such as from about 100 nm to about 125 nm, or from about 125 nm to about 150 nm. However, the disclosure is not so limited and the height may be different than those described.

In some embodiments, sidewalls of the first pillars 175 and the second pillars 177 are tapered (e.g., angled). In some such embodiments, a width of the first pillars 175 and the second pillars 177 may be relatively less within upper portions of the respective first pillars 175 and the second pillars 177 than lower portions thereof. For example, a width $W_1$ of upper portions of the first pillars 175 and the second pillars 177 may be within a range from about 10 nm to about 15 nm, such as from about 10 nm to about 12.5 nm, or from about 12.5 nm to about 20 nm. A width $W_2$ of lower portions of the first pillars 175 and the second pillars 177 may be within a range from about 12.5 nm to about 17.5 nm, such as from about 12.5 nm to about 15.0 nm, or from about 15.0 to about 17.5 nm. However, the disclosure is not so limited and the widths $W_1$, $W_2$ may be different than those described.

With continued reference to FIG. 1W, after removing the portions of the base material 102 and forming the first pillars 175 and the second pillars 177, a dielectric material 176 (e.g., a gate oxide material, a gate dielectric material) may be formed over surfaces of the base material 102. Portions of the dielectric material 176 may vertically overlie and be in direct physical contact with upper surfaces of the remaining portions of the insulative material 132. The dielectric material 176 may be adjacent to, inside, and in direct physical contact with a sidewall of the base material 102 within the active word lines 174 and adjacent to, inside, and in direct physical contact with a sidewall of the band offset material 130 within the passing word line 172. Upper surfaces of each of the first pillars 175 and the second pillars 177 of the base material 102, the band offset material 130, and the dielectric material 176 may be substantially coplanar with one another.

The dielectric material 176 may be formed of and include one or more of silicon dioxide, silicon oxynitride, phosphosilicate glass, borosilicate glass, borophosphosilicate glass (BPSG), fluorosilicate glass, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), or combinations thereof. In some embodiments, the dielectric material 176 comprises silicon dioxide. The dielectric material 176 may comprise a material composition that differs from that of the insulative material 132 of the isolation structures 138.

In some embodiments, the dielectric material 176 of the active word lines 174 is formed by epitaxial growth from the base material 102 and from exposed surfaces of the insulative material 132. In some such embodiments, the epitaxially grown dielectric material 176 may be exposed to oxygen to form an oxide (e.g., silicon dioxide) of the dielectric material 176. In other embodiments, the dielectric material 176 is formed by deposition (e.g., one or more of ALD, PVD, CVD, LPCVD, PECVD).

After forming the dielectric material 176, a first electrode material 178 (e.g., a first gate electrode material) may be formed over the dielectric material 176. The first electrode material 178 may be formed of and include a conductive material. In some embodiments, the first electrode material 178 comprises titanium nitride.

A second electrode material 180 may be formed over the first electrode material 178 and adjacent to the dielectric material 176. The second electrode material 180 may be formed of and include a conductive material. For example, the second electrode material 180 may be formed of and include one or more of the materials described above with reference to the first electrode material 178. In some embodiments, the second electrode material 180 comprises polysilicon.

One or more (e.g., both) of the first electrode material 178 and the second electrode material 180 of the passing word line 172 is laterally adjacent to the band offset material 130 and separated therefrom by the dielectric material 176. The band offset material 130 may be laterally adjacent to each of the first electrode material 178 and the second electrode material 180 of the passing word line 172 along a combined vertical extent (e.g., height) of the first electrode material 178 and the second electrode material 180. As shown in FIG. 1W, the dielectric material 176 of the active word lines 174 is directly between an electrode (e.g., the first electrode material 178 and the second electrode material 180) and the base material 102, while the dielectric material 176 of the passing word line 172 is directly between another electrode and the band offset material 130.

Upper surfaces of the first electrode material 178 and the second electrode material 180 of each of the passing word lines 172 and the active word lines 174 are vertically below (e.g., in the Z-direction) the upper portions of the first pillars 175 and the second pillars 177. Since the first electrode material 178 and the second electrode material 180 of the active word lines 174 are formed below upper portions of the first pillars 175 and the second pillars 177, the active word lines 174 may be referred to herein as "recessed access devices" (RADs).

With continued reference to FIG. 1W, the passing word lines 172 may be formed laterally adjacent to the band offset material 130 and over (e.g., directly above) the isolation structures 138 including the insulative material 132. Accordingly, the isolation structures 138 are located adjacent to (e.g., below) the passing word lines 172. By way of comparison, the active word lines 174 may not be formed directly laterally adjacent to the band offset material 130 and may not be formed directly above the isolation structures 138. Accordingly, the active word lines 174 are substantially devoid (e.g., substantially free) of the band offset material 130.

Referring now to FIG. 1X, an insulative material 182 may be formed over the second electrode material 180 within regions between the first pillars 175 and the second pillars 177 and over the apparatus 100 (e.g., over the first pillars 175 and the second pillars 177). The insulative material 182 may be formed of and include one or more dielectric materials. A material composition of the insulative material 182 may be the same as or different than a material composition of the dielectric material 176. In some embodiments, the insulative material 182 comprises silicon nitride. In other embodiments, the insulative material 182 comprises silicon dioxide. Further, the insulative material 182 may comprise a material composition that differs from that of the insulative material 132 of the isolation structures 138.

As shown in FIG. 1X, the insulative material 132 is present within lower portions of the passing word line 172 without being present within upper portions of the passing word line 172 and without being present above an upper surface of the base material 102. In other words, the insulative material 132 is located below an elevation of the first electrode material 178 (e.g., within the lower regions 122 (FIG. 1I) of the openings 115, 120 (FIG. 1I)) without being located above an elevation of the first electrode material 178 (e.g., within the upper regions 124 (FIG. 1I) of the openings 115, 120) of the passing word line 172. Lower portions of the insulative material 182 are laterally adjacent to the band offset material 130 and separated therefrom by the dielectric material 176. Accordingly, the band offset material 130 is laterally adjacent to each of the first electrode material, the second electrode material, and the lower portions of the insulative material 182. In other words, the band offset material 130 extends from upper surfaces of first pillars 175 and the second pillars 177 of the base material 102 to a lowermost portion of the isolation structures 138 of the passing word line 172.

Following formation, the insulative material 182 may be exposed to a chemical mechanical planarization (CMP) process to facilitate or enhance the planarity of an upper boundary (e.g., upper surface) thereof. Openings may be formed within the insulative material 182 over the second pillars 177 and filled with a conductive material 184, which may comprise a conductive contact in electrical communication with a storage device 186 (e.g., a memory storage device, such as a capacitor). At least a portion of the conductive material 184 may be recessed within the base material 102 of the second pillars 177.

Openings may be formed within the insulative material 182 directly over the first pillars 175 and may be filled with a conductive material 188. The conductive material 188 may be in electrical communication with a conductive access line, such as a digit line or a bit line. At least a portion of the conductive material 188 may be recessed within the base material 102 of the first pillars 175 with lower surfaces of the conductive material 188 extending farther into the base material 102 relative to lower surfaces of the conductive material 184.

Forming one or more of the band offset material 130 and the insulative material 132 of the isolation structures 138 within the passing word lines 172 may facilitate improved performance of the apparatus 100. For example, the band offset material 130 may be formed laterally adjacent to the base material 102 and may include a material exhibiting a relatively higher bandgap than the base material 102. The presence of the heterojunction along the interface 126 between the band offset material 130 and base material 102 may reduce leakage of charge during the "off" state responsive to a reduction in band-to-band tunneling ("BTBT"). In some embodiments, a reduction in leakage of charge may be about 2.5 times compared to a conventional apparatus that does not include the band offset material 130 adjacent to the base material 102. The presence of the band offset material 130 in combination with the insulative material 132 may reduce the so-called passing word line disturb of memory cells associated with the storage devices 186 when an adjacent passing word line 172 is exposed to a voltage (e.g., to access a memory cell to which the passing word line is operably coupled). Accordingly, the apparatus 100 including band offset material 130 and the insulative material 132 exhibits improved row hammer performance properties compared to conventional apparatuses lacking the band offset material 130 and the insulative material 132 adjacent to the passing word lines 172.

Manufacturing processes according to embodiments of the disclosure may be simplified by selecting a band offset material 130 to exhibit a lattice constant similar to that of the base material 102. For example, selective formation of the band offset material 130 on the base material 102 may be achieved through epitaxial growth without the need for additional patterning and etching processes. Use of lattice-matched materials along the interface 126 may also reduce the number of defects in the band offset material 130. Further, the presence of the insulative material 132 of the isolation structures 138 laterally adjacent to the band offset material 130 may result in a relatively higher threshold voltage $V_t$ responsive to the insulative material 132 having a fixed negative charge compared to using a material having a fixed positive charge (e.g., silicon dioxide). In other words, selecting the insulative material 132 to include a material having a fixed negative charge may allow the isolation structures 138 to withstand an increased threshold voltage $V_t$ while maintaining desired BTBT during operation of the apparatus 100. It is believed that the band offset material 130 in combination with the insulative material 132 of the isolation structures 138 may reduce an amount of leakage from the storage devices 186 through the second pillars 177 during the "off" state without substantially affecting the current through the second pillars 177.

Thus, in accordance with embodiments of the disclosure an apparatus comprises active word lines extending within a semiconductive material, passing word lines extending adjacent to the active word lines within the semiconductive material, isolation regions adjacent to the passing word lines, and a band offset material adjacent to the passing word lines and the isolation regions. The semiconductive material exhibits a first bandgap and the band offset material exhibits a second, different bandgap.

Thus in accordance with further embodiments of the disclosure, a method of forming an apparatus comprises forming a band offset material within openings in a semiconductive material. A bandgap of the band offset material is different than a bandgap of the semiconductive material. The method comprises forming isolation structures comprising an insulative material adjacent to the band offset material within the openings in the semiconductive material, forming a dielectric material adjacent to the band offset material, and forming a conductive material adjacent to the dielectric material.

Apparatuses (e.g., the apparatus 100) including the band offset material 130 and the insulative material 132 of the isolation structures 138 within the passing word lines 172, according to embodiments of the disclosure, may be used in embodiments of electronic systems of the disclosure. For example, FIG. 2 is a block diagram of an electronic system 203, in accordance with embodiments of the disclosure. The electronic system 203 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 203 includes at least one memory device 205. The memory device 205 may include, for example, an embodiment of an apparatus (e.g., the apparatus 100) previously described with reference to FIGS. 1A through 1X including the band offset material 130 and the insulative material 132 of the isolation structures 138 within the passing word lines 172.

The electronic system 203 may further include at least one electronic signal processor device 207 (often referred to as a "microprocessor"). The electronic signal processor device 207 may, optionally, include an embodiment of an apparatus (e.g., the apparatus 100) previously described with reference to FIGS. 1A through 1X. The electronic system 203 may further include one or more input devices 209 for inputting information into the electronic system 203 by a user, such as, for example, a mouse or other pointing device, a keyboard, a touchpad, a button, or a control panel. The electronic system 203 may further include one or more output devices 211 for outputting information (e.g., visual or audio output) to a user such as, for example, a monitor, a display, a printer, an audio output jack, a speaker, etc. In some embodiments, the input device 209 and the output device 211 may comprise a single touchscreen device that can be used both to input information to the electronic system 203 and to output visual information to a user. The input device 209 and the output device 211 may communicate electrically with one or more of the memory device 205 and the electronic signal processor device 207.

Figure 3:
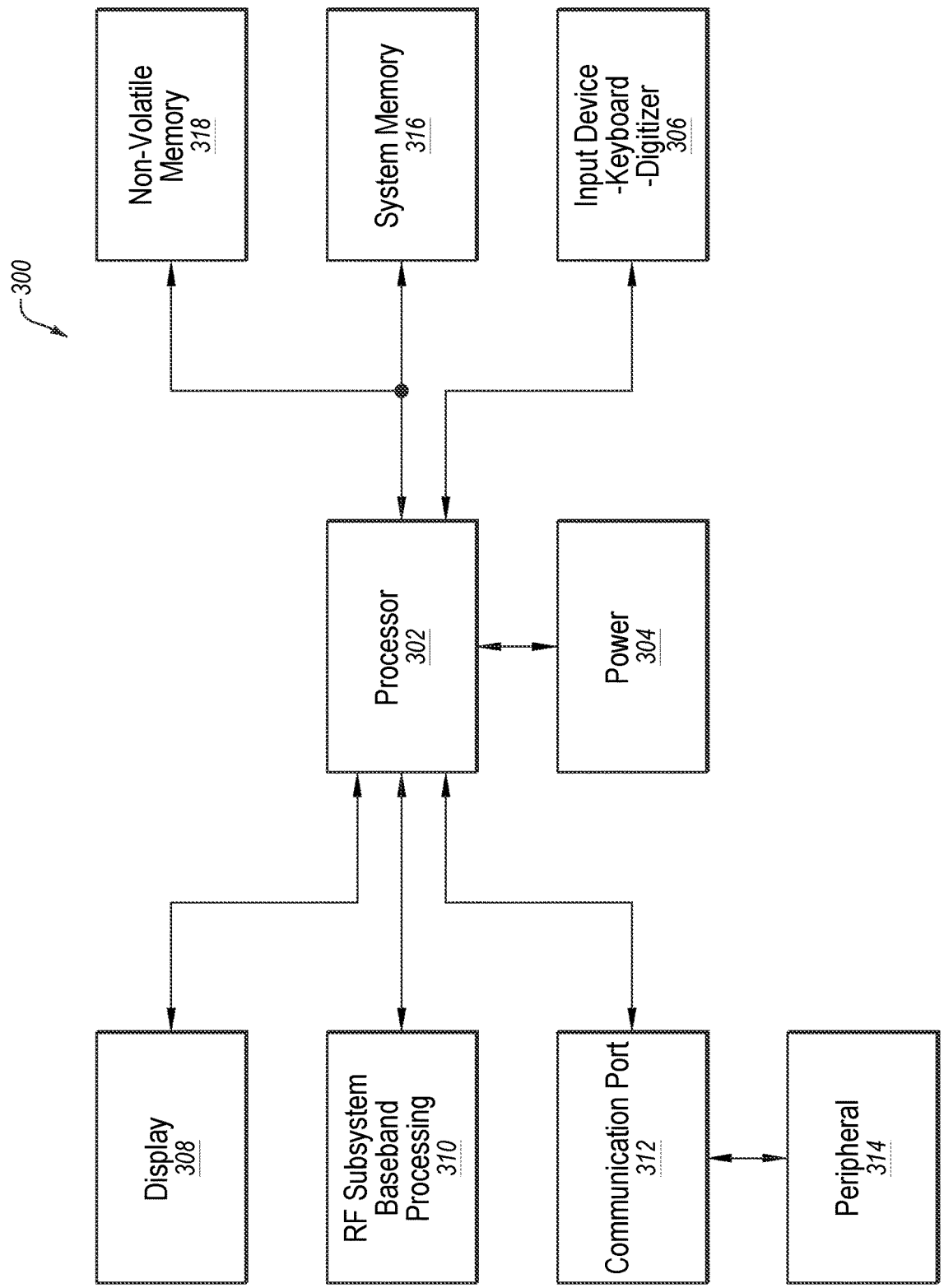
FIG. 3 is a block diagram of a processor-based system, in accordance with embodiments of the disclosure.

With reference to FIG. 3, depicted is a processor-based system 300. The processor-based system 300 may include various apparatuses (e.g., the apparatus 100) manufactured in accordance with embodiments of the present disclosure. The processor-based system 300 may be any of a variety of types such as a computer, pager, cellular phone, personal organizer, control circuit, or other apparatus. The processor-based system 300 may include one or more processors 302, such as a microprocessor, to control the processing of system functions and requests in the processor-based system 300. The processor 302 and other subcomponents of the processor-based system 300 may include apparatuses (e.g., the apparatus 100) manufactured in accordance with embodiments of the present disclosure.

The processor-based system 300 may include a power supply 304 in operable communication with the processor 302. For example, if the processor-based system 300 is a portable system, the power supply 304 may include one or more of a fuel cell, a power scavenging device, permanent batteries, replaceable batteries, and rechargeable batteries. The power supply 304 may also include an AC adapter; therefore, the processor-based system 300 may be plugged into a wall outlet, for example. The power supply 304 may also include a DC adapter such that the processor-based system 300 may be plugged into a vehicle cigarette lighter or a vehicle power port, for example.

Various other devices may be coupled to the processor 302 depending on the functions that the processor-based system 300 performs. For example, a user interface 306 may be coupled to the processor 302. The user interface 306 may include input devices such as buttons, switches, a keyboard, a light pen, a mouse, a digitizer and stylus, a touch screen, a voice recognition system, a microphone, or a combination thereof. A display 308 may also be coupled to the processor 302. The display 308 may include an LCD display, an SED display, a CRT display, a DLP display, a plasma display, an OLED display, an LED display, a three-dimensional projection, an audio display, or a combination thereof. Furthermore, an RF sub-system/baseband processor 310 may also be coupled to the processor 302. The RF sub-system/baseband processor 310 may include an antenna that is coupled to an RF receiver and to an RF transmitter (not shown). A communication port 312, or more than one communication port 312, may also be coupled to the processor 302. The communication port 312 may be adapted to be coupled to one or more peripheral devices 314, such as a modem, a printer, a computer, a scanner, or a camera, or to a network, such as a local area network, remote area network, intranet, or the Internet, for example.

The processor 302 may control the processor-based system 300 by implementing software programs stored in the memory. The software programs may include an operating system, database software, drafting software, word processing software, media editing software, or media playing software, for example. The memory is operably coupled to the processor 302 to store and facilitate execution of various programs. For example, the processor 302 may be coupled to system memory 316, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 316 may include volatile memory, non-volatile memory, or a combination thereof. The system memory 316 is typically large so that it can store dynamically loaded applications and data. In some embodiments, the system memory 316 may include apparatuses (e.g., the apparatus 100) described above.

The processor 302 may also be coupled to non-volatile memory 318, which is not to suggest that system memory 316 is necessarily volatile. The non-volatile memory 318 may include one or more of STT-MRAM, MRAM, read-only memory (ROM) such as an EPROM, resistive read-only memory (RROM), and flash memory to be used in conjunction with the system memory 316. The size of the non-volatile memory 318 is typically selected to be just large enough to store any necessary operating system, application programs, and fixed data. Additionally, the non-volatile memory 318 may include a high-capacity memory such as disk drive memory, such as a hybrid-drive including resistive memory or other types of non-volatile solid-state memory, for example. The non-volatile memory 318 may include apparatuses (e.g., the apparatus 100) described above.

Thus, in accordance with embodiments of the disclosure a system comprises a processor operably coupled to an input device and an output device, and a memory device operably coupled to the processor and comprising at least one electronic device. The at least one electronic device comprises a recessed access device within a base material, and a passing word line adjacent to the recessed access device within the base material. The recessed access device comprises a first electrode and the passing word line comprises a second electrode. The at least one electronic device comprises a band offset material adjacent to the passing word line, and an isolation structure comprising an insulative material adjacent to the passing word line. The band offset material separates the insulative material from the base material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An apparatus, comprising:
    active word lines extending within a semiconductive material;
    passing word lines extending adjacent to the active word lines within the semiconductive material;
    isolation regions adjacent to the passing word lines; and
    a band offset material adjacent to the passing word lines and the isolation regions, the semiconductive material exhibiting a first bandgap and the band offset material exhibiting a second, different bandgap.

2. The apparatus of claim 1, wherein the second, different bandgap is relatively larger than the first bandgap.

3. The apparatus of claim 1, wherein the first bandgap of the semiconductive material is between about 0.4 eV and about 1.4 eV, and the second bandgap of the band offset material is between about 1.5 eV and about 4.0 eV.

4. The apparatus of claim 1, wherein the semiconductive material comprises a polycrystalline silicon material and the band offset material comprises one or more of aluminum arsenide, gallium arsenide, gallium phosphide, and zinc sulfide.

5. The apparatus of claim 1, wherein the band offset material directly contacts the semiconductive material along a height of the passing word lines, an interface between the band offset material and the semiconductive material comprising a heterojunction.

6. The apparatus of claim 1, wherein the band offset material exhibits a lattice constant within about ±5% of a multiple of a lattice constant or bond length of the semiconductive material.

7. The apparatus of claim 1, wherein the isolation regions comprise an insulative material having a fixed negative charge.

8. The apparatus of claim 1, wherein the active word lines are substantially devoid of the band offset material.

9. The apparatus of claim 1, further comprising:
    first pillars of the semiconductive material; and
    second pillars of the semiconductive material adjacent to the first pillars, wherein the active word lines extend between one of the first pillars and one of the second pillars and the passing word lines extend between two of the second pillars.

10. The apparatus of claim 9, further comprising storage devices electrically coupled to the second pillars, wherein the apparatus is a dynamic random access memory (DRAM) device comprising at least one array of memory cells.

11. A method of forming an apparatus, the method comprising:
forming a band offset material within openings in a semiconductive material, a bandgap of the band offset material different than a bandgap of the semiconductive material;
forming isolation structures comprising an insulative material adjacent to the band offset material within the openings in the semiconductive material;
forming a dielectric material adjacent to the band offset material; and
forming a conductive material adjacent to the dielectric material.

12. The method of claim 11, wherein forming the band offset material comprises conformally forming the band offset material directly on exposed surfaces of the semiconductive material.

13. The method of claim 11, wherein forming the band offset material comprises epitaxially growing the band offset material within the openings in the semiconductive material.

14. The method of claim 11, further comprising:
forming a first pattern of openings in a material;
forming a second pattern of openings laterally offset from the first pattern of openings in the material; and
transferring the first pattern of openings and the second pattern of openings to the semiconductive material prior to forming the band offset material.

15. The method of claim 11, further comprising removing portions of the semiconductive material between the isolation structures concurrently with recessing portions of the insulative material of the isolation structures.

16. The method of claim 15, wherein removing the portions of the semiconductive material comprises forming pillars of the semiconductive material between the isolation structures.

17. The method of claim 11, further comprising forming active regions between the isolation structures, wherein forming the band offset material comprises forming the band offset material within the openings in the semiconductive material containing the isolation structures without forming the band offset material within the active regions.

18. A system, comprising:
a processor operably coupled to an input device and an output device; and
a memory device operably coupled to the processor and comprising at least one electronic device, the at least one electronic device comprising:
a recessed access device within a base material, the recessed access device comprising a first electrode;
a passing word line adjacent to the recessed access device within the base material, the passing word line comprising a second electrode;
a band offset material adjacent to the passing word line; and
an isolation structure comprising an insulative material adjacent to the passing word line, the band offset material separating the insulative material from the base material.

19. The system of claim 18, wherein the band offset material exhibits a relatively higher electron mobility than an electron mobility of the base material.

20. The system of claim 18, further comprising:
a first dielectric material directly between the first electrode and the base material; and
a second dielectric material directly between the second electrode and the band offset material.

21. The system of claim 20, wherein a material composition of each of the first dielectric material and the second dielectric material differs from a material composition of the insulative material of the isolation structure.

22. The system of claim 18, further comprising an additional insulative material overlying the first electrode and the second electrode, wherein the additional insulative material comprises silicon dioxide and the insulative material of the isolation structure is substantially devoid of silicon dioxide.

23. The system of claim 18, wherein the isolation structure is below the passing word line and the band offset material is laterally adjacent to each of the isolation structure and the passing word line.

* * * * *